(12) United States Patent
Lee et al.

(10) Patent No.: US 10,312,477 B2
(45) Date of Patent: Jun. 4, 2019

(54) LIGHT EMITTING STRUCTURE, DISPLAY DEVICE INCLUDING A LIGHT EMITTING STRUCTURE AND METHOD OF MANUFACTURING A DISPLAY DEVICE INCLUDING A LIGHT EMITTING STRUCTURE

(71) Applicant: Samsung Display Co., Ltd., Yongin-si, Gyeonggi-do (KR)

(72) Inventors: Sung-Soo Lee, Yongin-si (KR); Ok-Keun Song, Yongin-si (KR); Se-Il Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/953,342

(22) Filed: Apr. 13, 2018

(65) Prior Publication Data

US 2018/0241010 A1    Aug. 23, 2018

Related U.S. Application Data

(60) Continuation of application No. 14/859,156, filed on Sep. 18, 2015, now Pat. No. 9,947,903, which is a (Continued)

(30) Foreign Application Priority Data

Jun. 29, 2011    (KR) .................. 10-2011-0063644

(51) Int. Cl.
*H01L 51/52*    (2006.01)
*H01L 51/56*    (2006.01)
(Continued)

(52) U.S. Cl.
CPC .......... *H01L 51/56* (2013.01); *H01L 27/3211* (2013.01); *H01L 27/3272* (2013.01);
(Continued)

(58) Field of Classification Search
CPC ............. H01L 51/5096; H01L 51/5265; H01L 51/5278
See application file for complete search history.

(56) References Cited

U.S. PATENT DOCUMENTS 7,843,129 B2    11/2010    Lee et al.
7,888,860 B2    2/2011    Sung et al.
(Continued)

FOREIGN PATENT DOCUMENTS

CN    101308863 A    11/2008
CN    101710608 A    5/2010
(Continued)

OTHER PUBLICATIONS

European Search Report dated Oct. 29, 2012 of the corresponding European Patent Application No. 12156715.0, (9 pages).
(Continued)

*Primary Examiner* — Thomas L Dickey
(74) *Attorney, Agent, or Firm* — Lewis Roca Rothgerber Christie LLP

(57) ABSTRACT

A light emitting structure includes a first hole injection layer, a first organic light emitting layer, a charge generation layer, a second hole injection layer, a second organic light emitting layer, an electron transfer layer, and a blocking member. The light emitting structure has first, second, and third sub-pixel regions. The first organic light emitting layer may be on the first hole injection layer. The charge generation layer may be on the first organic light emitting layer. The second hole injection layer may be on the charge generation layer. The second organic light emitting layer may be on the second hole injection layer. The electron transfer layer may be on the second organic light emitting layer. The blocking member may be at at least one of the first to the third sub-pixel regions.

14 Claims, 6 Drawing Sheets

Related U.S. Application Data division of application No. 13/299,311, filed on Nov. 17, 2011, now Pat. No. 9,172,058.

(51) Int. Cl.
*H01L 27/32* (2006.01)
*H01L 51/50* (2006.01)

(52) U.S. Cl.
CPC ........ *H01L 51/5265* (2013.01); *H01L 51/504* (2013.01); *H01L 51/5096* (2013.01); *H01L 2227/323* (2013.01)

(56) References Cited

U.S. PATENT DOCUMENTS

| | | |
|---|---|---|
| 8,053,975 B2 | 11/2011 | Chun et al. |
| 8,288,784 B2 | 10/2012 | Cho |
| 8,421,341 B2 | 4/2013 | Kim et al. |
| 2001/0017409 A1 | 8/2001 | Hiroki et al. |
| 2005/0248267 A1* | 11/2005 | Gyoutoku ........... H01L 51/5278 313/506 |
| 2006/0017377 A1* | 1/2006 | Ryu .................... H01L 51/5265 313/504 |
| 2006/0084347 A1 | 4/2006 | Tutt et al. |
| 2006/0232202 A1 | 10/2006 | Matsuda et al. |
| 2009/0051275 A1 | 2/2009 | Kobayashi et al. |
| 2010/0053038 A1 | 3/2010 | Sakamoto |
| 2010/0176412 A1 | 7/2010 | Yokoyama et al. |
| 2011/0062462 A1 | 3/2011 | Burrows et al. |
| 2011/0073885 A1 | 3/2011 | Kim et al. |
| 2012/0183676 A1 | 7/2012 | Sonoda et al. |

FOREIGN PATENT DOCUMENTS

| | | |
|---|---|---|
| CN | 102024844 A | 4/2011 |
| CN | 102034850 A | 4/2011 |
| JP | 2002-208483 | 7/2002 |
| JP | 2006-041471 | 2/2006 |
| JP | 2006-324016 | 11/2006 |
| JP | 2008-288201 | 11/2008 |
| JP | 2009-048892 | 3/2009 |
| JP | 2010-056016 | 3/2010 |
| KR | 10-2008-0018557 A | 2/2008 |
| KR | 10-2009-0029009 A | 3/2009 |
| TW | 200412194 A | 7/2004 |
| WO | WO 2004/061878 A2 | 7/2004 |
| WO | WO 2011/034011 A1 | 3/2011 |

OTHER PUBLICATIONS

JPO Office action dated Sep. 1, 2015, for corresponding Japanese Patent application 2011-249766, (4 pages).

SIPO Office action dated Sep. 25, 2015, for corresponding Chinese Patent application 201210061071.3, (12 pages).

* cited by examiner

LIGHT EMITTING STRUCTURE, DISPLAY DEVICE INCLUDING A LIGHT EMITTING STRUCTURE AND METHOD OF MANUFACTURING A DISPLAY DEVICE INCLUDING A LIGHT EMITTING STRUCTURE

CROSS-REFERENCE TO RELATED APPLICATION

This application is a continuation of U.S. patent application Ser. No. 14/859,156, filed Sep. 18, 2015, which is a divisional of U.S. patent application Ser. No. 13/299,311, filed Nov. 17, 2011, which claims priority to and the benefit of Korean Patent Application No. 10-2011-0063644, filed Jun. 29, 2011, the entire content of all of which is incorporated herein by reference.

BACKGROUND

1. Field

Example embodiments of the present invention relate to a light emitting structure, a display device including a light emitting structure, and a method of manufacturing a display device including a light emitting structure.

2. Description of Related Art

An organic light emitting display (OLED) device displays information such as images and characters using light generated from an organic layer therein. As for the organic light emitting display device, light may be generated by combination of holes from an anode and electrons from a cathode occurred at the organic layer between the anode and the cathode. In various display devices such as a liquid crystal display (LCD) device, a plasma display (PDP) device, and a field emission display (FED) device, the organic light emitting display device has features such as wide viewing angle, fast response time, thin thickness, and low power consumption, so that the organic light emitting display device is widely employed in various electrical and electronic apparatuses, for example, televisions, monitors, mobile communication devices, MP3 players, portable display devices, etc. Recently, the organic light emitting display device has been regarded as one of the most promising next-generation display devices.

In a conventional organic light emitting display device, electrons and holes provided from electrodes may be recombined at an organic layer to generate excitons, so that light having a specific wavelength may be generated by the energy of the excitons to display images. Although the organic light emitting display device may have a single layer structure, a multi-layer structure, or a color conversion structure, the multi-layer structure is widely applied in the organic light emitting display device. The multi-layer structure may include organic layers that emit red light, green light, and blue light, respectively, and thus red, green, and blue lights may be combined to generate white light. However, the conventional organic light emitting display may have some disadvantages such as relatively low functional stability of the organic layers and low purity of colors of light. Even though a color filter may be disposed over the organic layers to improve the purity of colors of light, manufacturing processes may be complicated and also manufacturing cost for the display device may be increased. Further, the conventional organic light emitting display device may have low luminance efficiency because of the color filter.

SUMMARY

Example embodiments of the present invention are directed toward a light emitting structure having improved color purity, enhanced color reproducibility, and increased brightness.

Example embodiments of the present invention are directed toward a display device capable of displaying a high resolution image with improved color purity and enhanced brightness.

Example embodiments of the present invention are directed toward a method of manufacturing a display device capable of displaying a high resolution image with improved color purity and increased brightness.

According to an example embodiment, a light emitting structure includes a first hole injection layer, a first organic light emitting layer, a charge generation layer, a second hole injection layer, a second organic light emitting layer, an electron transfer layer, and a blocking member. The light emitting structure may be divided into a first sub-pixel region, a second sub-pixel region, and a third sub-pixel region. The first organic light emitting layer may be on the first hole injection layer. The charge generation layer may be on the first organic light emitting layer. The second hole injection layer may be on the charge generation layer. The second organic light emitting layer may be on the second hole injection layer. The electron transfer layer may be on the second organic light emitting layer. The blocking member may be at at least one of the first sub-pixel region, the second sub-pixel region, or the third sub-pixel region.

In example embodiments, a first optical resonance distance in the first sub-pixel region, a second optical resonance distance in the second sub-pixel region, and a third optical resonance distance in the third sub-pixel region may be different from each other.

In example embodiments, the light emitting structure may include an optical distance controlling insulation layer at at least one of the first sub-pixel region, the second sub-pixel region, or the third sub-pixel region.

In example embodiments, the optical distance controlling insulation layer may be under the first hole injection layer.

In example embodiments, the optical distance controlling insulation layer may have different thicknesses in adjacent sub-pixel regions.

In example embodiments, the optical distance controlling insulation layer may include a material that is the same as that of the first hole injection layer.

In example embodiments, the first optical resonance distance may be adjusted to generate an optical resonance for a red light emitted from the first organic light emitting layer or the second organic light emitting layer, the second optical resonance distance may be adjusted to generate an optical resonance for a green light emitted from the first organic light emitting layer or the second organic light emitting layer, and the third optical resonance distance may be adjusted to generate an optical resonance for a blue light emitted from the first organic light emitting layer or the second organic light emitting layer.

In example embodiments, the first organic light emitting layer may include a blue-light emitting film, and the second organic light emitting layer may include a green-light emitting film and a red-light emitting film, or a single light emitting film adapted to emit green light and red light.

In example embodiments, the blocking member may be between the second hole injection layer and the first organic light emitting layer at the first sub-pixel region, and the blocking member may be adapted to block a movement of electrons from the second hole injection layer to the first organic light emitting layer at the first sub-pixel region.

In example embodiments, the blocking member may be between the charge generation layer and the first organic light emitting layer at the first sub-pixel region, and the blocking member may be adapted to block a movement of excitons generated at the first organic light emitting layer at the first sub-pixel region.

In example embodiments, the first organic light emitting layer may include a green-light emitting film and a red-light emitting film, or a single light emitting film adapted to emit green light and red light, and the second organic light emitting layer may include a blue-light emitting film.

In example embodiments, the blocking member may be between the second hole injection layer and the second organic light emitting layer at the first sub-pixel region, and the blocking member may be adapted to block a movement of electrons to the second organic light emitting layer at the first sub-pixel region.

In example embodiments, the blocking member may be between the electron transfer layer and the second organic light emitting layer at the first sub-pixel region, and the blocking member may be adapted to block a movement of excitons generated from the second organic light emitting layer at the first sub-pixel region.

In example embodiments, the blocking member may include an electron blocking layer or an exciton quenching layer.

In example embodiments, the blocking member may include fullerene, a polymer including substituted triarylamine, a carbazole based polymer, 1,1-Bis(4-(N,N-di-p-tolylamino)phenyl)cyclohexane (TAPC), 1,1-Bis(4-(N,N-di-p-tolylamino)phenyl)cyclopentane, 4,4'-(9H-fluoren-9-ylidene)bis[N,N-bis(4-methylphenyl)-benzenamine, 1,1-Bis(4-(N,N-di-p-tolylamino)phenyl)-4-phenylcyclohexane, 1,1-Bis(4-(N,N-di-p-tolylamino)phenyl)-4-methylcyclohexane, 1,1-Bis(4-(N,N-di-p-tolylamino)phenyl)-3-phenylpropane, Bis[4-(N, N-diethylamino)-2-methylphenyl](4-methylphenyl)methane, Bis[4-(N,N-diethylamino)-2-methylphenyl](4-methylphenyl)ethane, 4-(4-Diethylaminophenyl)triphenylmethane, 4,4'-Bis(4-diethylaminophenyl)diphenylmethane, N,N-bis[2,5-dimethyl-4-[(3-methylphenyl)phenylamino]phenyl]-2,5-dimethyl-N'-(3-methy (phenyl)-N'-phenyl-1,4-benzenediamine, 4-(9H-carbazol-9-yl)-N,N-bis[4-(9H-carbazol-9-yl)phenyl]-benzenamine (TCTA), 4-(3-phenyl-9H-carbazol-9-yl)-N,N-bis[4(3-phenyl-9H-carbazol-9-yl)phenyl]-benzenamine, 9,9'-(2,2'-dimethyl[1,1'-biphenyl]-4,4'-diyl)bis-9H-carbazole (CDBP), 9,9'[1,1'-biphenyl]-4,4'-diyl)bis-9H-carbazole (CBP), 9,9'-(1,3-phenylene)bis-9H-carbazole (mCP), 9,9'-(1,4-phenylene)bis-9H-carbazole, 9,9',9"'-(1,3,5-benzenetriyl)tris-9H-carbazole, 9,9'-(1,4-phenylene)bis[N,N,N',N'-tetraphenyl-9H-carbazole-3,6-diamine, 9-[4-(9H-carbazol-9-yl)phenyl]-N,N-diphenyl-9H-carbazol-3-amine, 9,9'-(1,4-phenylene)bis[N,N-diphenyl-9H-carbazol-3-amine, 9-[4-(9H-carbazol-9-yl)phenyl]-N,N,N',N'-tetraphenyl-9H-carbazole-3,6-diamine, 9-phenyl-9H-carbazol, etc.

According to example embodiments, a display device includes a substrate, a first electrode, a light emitting structure, and a second electrode. The substrate may include a first sub-pixel region, a second sub-pixel region, and a third sub-pixel region. The first electrode may be on the substrate. The light emitting structure may be on the first electrode. The light emitting structure may include a blocking member at at least one of the first sub-pixel region, the second sub-pixel region, or the third sub-pixel region. The second electrode may be on the light emitting structure. A first optical resonance distance between the first electrode and the second electrode at the first sub-pixel region, a second optical resonance distance between the first electrode and the second electrode at the second sub-pixel region, and a third optical resonance distance between the first electrode and the second electrode at the third sub-pixel region may be different from each other.

In example embodiments, the light emitting structure may include a first hole injection layer, a first organic light emitting layer, a charge generation layer, a second hole injection layer, a second organic light emitting layer, and an electron transfer layer. The first hole injection layer may be on the first electrode. The first organic light emitting layer may be on the first hole injection layer. The charge generation layer may be on the first organic light emitting layer. The second hole injection layer may be on the charge generation layer. The second organic light emitting layer may be on the second hole injection layer. The electron transfer layer may be on the second organic light emitting layer.

In example embodiments, the light emitting structure may further include an optical distance controlling insulation layer on the first electrode. The optical distance controlling insulation layer may have different thicknesses in adjacent sub-pixel regions.

In example embodiments, the first optical resonance distance may be adjusted to generate an optical resonance for a red light emitted from the first organic light emitting layer or the second organic light emitting layer, the second optical resonance distance may be adjusted to generate an optical resonance for a green light emitted from the first organic light emitting layer or the second organic light emitting layer, and the third optical resonance distance may be adjusted to generate an optical resonance for a blue light emitted from the first organic light emitting layer or the second organic light emitting layer.

In example embodiments, the first organic light emitting layer may include a blue-light emitting film. The second organic light emitting layer may include a green-light emitting film and a red-light emitting film, or a single light emitting layer adapted to emit green light and red light.

In example embodiments, the blocking member may be between the first hole injection layer and the first organic light emitting layer at the first sub-pixel region, and the blocking member may be adapted to block a movement of electrons from the first hole injection layer to the first organic light emitting layer at the first sub-pixel region.

In example embodiments, the blocking member may be between the charge generation layer and the first organic light emitting layer at the first sub-pixel region, and blocking member may be adapted to block a movement of excitons generated from the first organic light emitting layer at the first sub-pixel region.

In example embodiments, the first organic light emitting layer may include a green-light emitting film and a red light-emitting film, or a single light emitting layer adapted to emit green light and red light. The second organic light emitting layer may include a blue light-emitting film.

In example embodiments, the blocking member may be between the second hole injection layer and the second organic light emitting layer at the first sub-pixel region, and the blocking member may be adapted to block a movement of electrons to the second organic light emitting layer at the first sub-pixel region.

In example embodiments, the blocking member may be between the electron transfer layer and the second organic light emitting layer at the first sub-pixel region, and the blocking member may be adapted to block a movement of excitons generated from the second organic light emitting layer at the first sub-pixel region.

According to example embodiments, there is provided a method of manufacturing a display device. In the method, a first electrode may be formed on a substrate. The substrate may have a first sub-pixel region, a second sub-pixel region, and a third sub-pixel region. A light emitting structure may be formed on the first electrode. The light emitting structure may include an optical distance controlling layer and a blocking member. A second electrode may be formed on the light emitting structure. A first optical resonance distance between the first electrode and the second electrode at the first sub-pixel region, a second optical resonance distance between the first electrode and the second electrode at the second sub-pixel region, and a third optical resonance distance between the first electrode and the second electrode at the third sub-pixel region may be different from each other.

In example embodiments, the optical distance controlling insulation layer may be formed at at least one of the first sub-pixel region, the second sub-pixel region, or the third sub-pixel region.

In example embodiments, forming the optical distance controlling insulation layer may include forming the optical distance controlling insulation layer on the first electrode by a laser induced thermal imaging process.

In example embodiments, forming the optical distance controlling insulation layer may further include laminating a donor substrate on the substrate, irradiating a laser beam to at least one region of the donor substrate, the at least one region of the donor substrate corresponding to at least one of the first, the second, and the third sub-pixel regions, and removing the donor substrate from the substrate.

In example embodiments, forming the light emitting structure may further include forming a first organic light emitting layer on the optical distance controlling insulation layer, forming a charge generation layer on the first organic light emitting layer, and forming a second organic light emitting layer on the charge generation layer.

In example embodiments, the blocking member may be between the optical distance controlling layer and the first organic light emitting layer at at least one of the first, the second, and the third sub-pixel regions.

In example embodiments, the blocking member may be formed by a laser induced thermal imaging process.

In example embodiments, forming the blocking member may further include laminating a donor substrate on the substrate, irradiating a laser beam to at least one region of the donor substrate, the at least one region of the donor substrate corresponding to at least one of the first, the second, and the third sub-pixel regions, and removing the donor substrate from the substrate.

In example embodiments, the blocking member may be between the first organic light emitting layer and the charge generation layer at at least one of the first, the second, and the third sub-pixel regions.

In example embodiments, the blocking member may be between the second organic light emitting layer and the second electrode at at least one of the first, the second, and the third sub-pixel regions.

According to example embodiments, each of sub pixel regions may have optical resonance distances which may be substantially different from each other, so that lights having different wavelengths may be emitted from each of the sub-pixel regions. Therefore, color purity, brightness, and color gamut of a display device may be improved, and a driving voltage of the display device may be reduced thereby to extend a lifetime of the display device. Further, a blue light emitting layer may be separated from a red light emitting layer and/or a green light emitting layer, so that color stability may be improved, and a lifetime of the blue light emitting layer may be extended. The display device may display high resolution images having high color purity and high brightness without a color filter. In the manufacturing process of the display device, additional layers such as the color filter may not need to be formed, and thus a cost of the manufacturing process may be reduced, and the manufacturing process may be simplified. Further, the color filter may not be disposed on the light emitting layers, so that a reduction of the brightness by the color filter may be prevented.

BRIEF DESCRIPTION OF THE DRAWINGS

Example embodiments may be understood in more detail from the following description taken in conjunction with the accompanying drawings, in which.

DETAILED DESCRIPTION OF THE EMBODIMENTS

Figure 1:
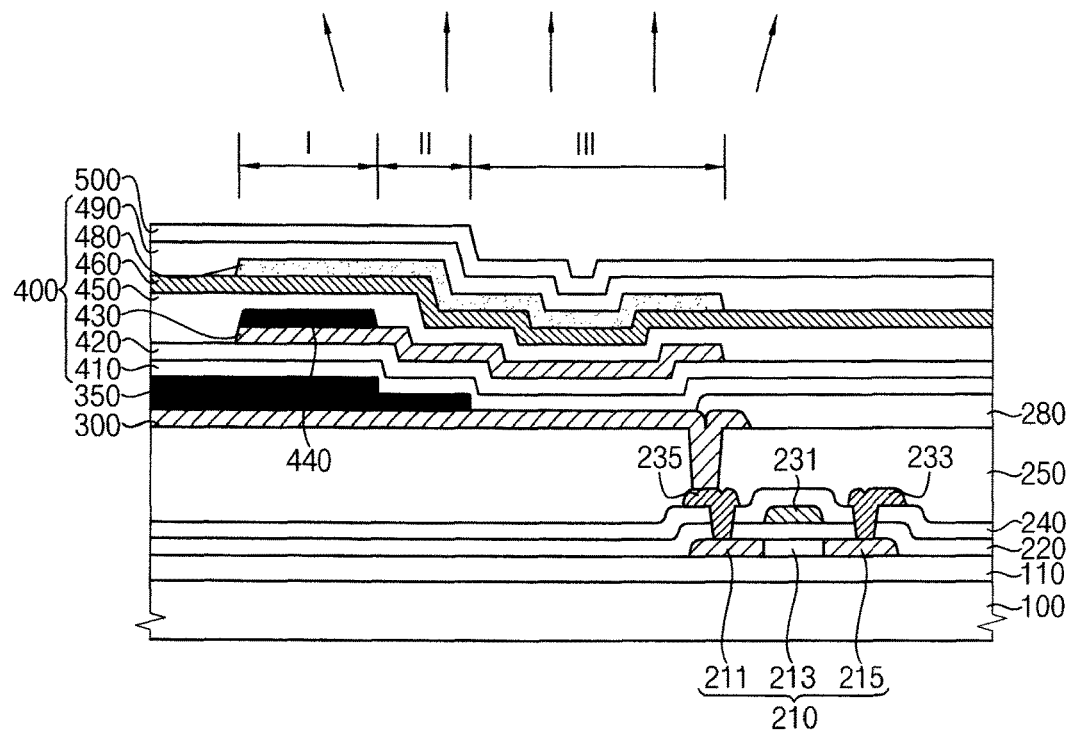
FIG. 1 is a cross-sectional view illustrating a display device having a light emitting structure in accordance with example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to," or "coupled to" another element or layer, it can be directly on, connected, or coupled to the other element or layer, or one or more intervening elements or layers may be present. When an element is referred to as being "directly on," "directly connected to," or "directly coupled to" another element or layer, there may be no intervening elements or layers present. Like numerals refer to like elements throughout. As used herein, the term "and/or" includes any and all combinations of one or more of the associated listed items.

It will be understood that, although the terms first, second, third, fourth, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the invention.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein are interpreted accordingly.

The terminology used herein is for the purpose of describing particular example embodiments only and is not intended to limit the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a display device having a light emitting structure in accordance with example embodiments.

Referring to FIG. 1, the display device may include a substrate 100, a switching structure, a first electrode 300, a light emitting structure 400, a second electrode 500, etc.

In example embodiments, the display device may include a display region where the light emitting structure 400 may be positioned and a non-display region adjacent to the display region. Further, the display region of the display device may include a first sub-pixel region (I), a second sub-pixel region (II), and a third sub-pixel region (III). In this case, the light emitting structure 400 may also have the first sub-pixel region (I), the second sub-pixel region (II), and the third sub-pixel region (III).

The switching structure may be disposed between the substrate 100 and the first electrode 300, and the light emitting structure 400 may be located between the first electrode 300 and the second electrode 500. In this case, the switching structure may be on the substrate 100.

A buffer layer 110 may be disposed on the substrate 100. The buffer layer 110 may prevent impurities from being diffused from the substrate 100. The buffer layer 110 may improve a flatness of the substrate 100. Further, the buffer layer 110 may reduce a stress generated in a process for forming the switching structure on the substrate 100. The buffer layer 110 may include an oxide, a nitride, an oxynitride, etc. For example, the buffer layer 110 may have a single layer structure or a multi-layer structure including silicon oxide (SiOx), silicon nitride (SiNx) and/or silicon oxynitride (SiOxNy).

When the display device is an active matrix type, the switching structure may be disposed between the substrate 100 and the first electrode 300. The switching structure may include a switching device and one or more insulation layers. In example embodiments, the switching device may include a thin film transistor having a semiconductor layer containing, for example, silicon. In some example embodiments, the switching device may include an oxide semiconductor device having an active layer containing a semiconductor oxide.

When the switching device in the switching structure includes the thin film transistor, the switching device may include a semiconductor layer 210, a gate insulation layer 220, a gate electrode 231, a source electrode 233, a drain electrode 235, etc.

The semiconductor layer 210 may be disposed on the buffer layer 110. The gate insulation layer 220 may be positioned on the buffer layer 110 to cover the semiconductor layer 210. The semiconductor layer 210 may include a first impurity region 211, a channel region 213, and a second impurity region 215. In this case, the first impurity region 211 and the second impurity region 215 may serve as a drain region and a source region of the thin film transistor, respectively. The semiconductor layer 210 may include a polysilicon, a polysilicon doped with impurities, an amorphous silicon, an amorphous silicon doped with impurities, etc. These may be used alone or in a combination thereof.

The gate insulation layer 220 may include an oxide, an organic insulation material, etc. For example, the gate insulation layer 220 may include silicon oxide, hafnium oxide (HfOx), aluminum oxide (AlOx), zirconium oxide (ZrOx), titanium oxide (TiOx), tantalum oxide (TaOx), a benzocyclobutene (BCB) based resin, an acryl-based resin, etc. The gate insulation layer 220 may have a single layer structure or a multi-layer structure including an oxide film and/or an organic insulation material film.

The gate electrode 231 may be located on the gate insulation layer 220 adjacent to the semiconductor layer 210. For example, the gate electrode 231 may be disposed on the gate insulation layer 220 under which the channel region 213 of the semiconductor layer 210 may be positioned. The gate electrode 231 may include a metal, a metal nitride, a conductive metal oxide, a transparent conductive material, etc. For example, the gate electrode 231 may include aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), chromium (Cr), molybdenum (Mo), an alloy containing molybdenum, titanium (Ti), titanium nitride (TiNx), platinum (Pt), tantalum (Ta), neodymium (Nd), scandium (Sc), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. The gate electrode 231 may have a single layer structure or a multi-layer structure including a metal film, a metal nitride film, a conductive metal oxide film, and/or a transparent conductive material film.

In example embodiments, a gate line (not illustrated) connected to the gate electrode 231 may be disposed on the gate insulation layer 220. A gate signal may be applied to the gate electrode 231 through the gate line. The gate line may include a material substantially that is the same as or substantially similar to that of the gate electrode 231. For example, the gate line may have a single layer structure or a multi-layer structure including a metal film, a metal nitride film, a conductive metal oxide film, and/or a transparent conductive material film.

An insulating interlayer 240 may be disposed on the gate insulation layer 220 to cover the gate electrode 231. The insulating interlayer 240 may include an oxide, a nitride, an oxynitride, an organic insulation material, etc. For example, the insulating interlayer 240 may include silicon oxide, silicon nitride, silicon oxynitride, an acryl-based resin, a polyimide-based resin, a siloxane-based resin, etc. These may be used alone or in a combination thereof. The insulating interlayer 240 may have a uniform thickness along a profile of the gate electrode 231. In some example embodiments, the insulating interlayer 240 may cover the gate electrode 231, and may also have a substantially level upper surface.

The source electrode 233 and the drain electrode 235 may pass through the insulating interlayer 240 and the gate insulation layer 220. The source electrode 233 and the drain electrode 235 may make contact with the second impurity region 215 and the first impurity region 211, respectively. Each of the source electrode 233 and the drain electrode 235 may include a metal, a metal nitride, a conductive metal oxide, a transparent conductive material, etc. For example, the source and the drain electrodes 233 and 235 may include aluminum, an alloy containing aluminum, aluminum nitride, silver, an alloy containing silver, tungsten, tungsten nitride, copper, an alloy containing copper, nickel, chromium, molybdenum, an alloy containing molybdenum, titanium, titanium nitride, platinum, tantalum, neodymium, scandium, tantalum nitride, strontium ruthenium oxide, zinc oxide, indium tin oxide, tin oxide, indium oxide, gallium oxide, indium zinc oxide, etc. These may be used alone or in a combination thereof. Each of the source electrode 233 and the drain electrode 235 may have a single layer structure or a multi-layer structure including a metal film, a metal nitride film, a conductive metal oxide film, and/or a transparent conductive material film.

In example embodiments, a data line (not illustrated) connected to the source electrode 233 may be disposed on the insulating interlayer 240, and a data signal may be applied to the source electrode 233 through the data line. The data line may include a material that is substantially the same as or substantially similar to that of the source electrode 233. Further, the data line may have a single layer structure or a multi-layer structure including a metal film, a metal nitride film, a conductive metal oxide film, and/or a transparent conductive material film. The gate line and the data line may be substantially perpendicular to each other, so that the display region of the display device may be defined by the gate line and the data line.

An insulation layer 250 of the switching structure may be located on the insulating interlayer 240 to cover the source electrode 233 and the drain electrode 235. A hole may be formed through the insulation layer 250 to partially expose the drain electrode 235. The insulation layer 250 may include a transparent insulation material such as a transparent plastic, a transparent resin, etc. For example, the insulation layer 250 may include a benzocyclobutene-based resin, an olefin-based resin, a polyimide-based resin, an acryl-based resin, a polyvinyl-based resin, a siloxane-based resin, etc. These may be used alone or in a combination thereof. In example embodiments, the insulation layer 250 may have a substantially flat upper surface obtained by a planarization process. For example, an upper portion of the insulation layer 250 may be planarized by a chemical mechanical polishing (CMP) process, an etch-back process, etc. In some example embodiments, the insulation layer 250 may include a material having a self planarizing property without requiring a planarization process.

In the display device described with reference to FIG. 1, the switching device including the thin film transistor may have a top gate structure in which the gate electrode 231 may be disposed on the semiconductor layer 210, but the configuration of the switching device may not be limited thereto. For example, the switching device may have a bottom gate structure in which the gate electrode 231 may be disposed under the semiconductor layer 210, or may include the oxide semiconductor device having the active layer containing a semiconductor oxide.

Referring now to FIG. 1, the first electrode 300 may be disposed on the insulation layer 250. In example embodiments, the first electrode 300 may partially or fully fill the hole formed through the insulation layer 250, and thus the first electrode 300 may make electrical contact with the switching device. For example, the first electrode 300 may make contact with the drain electrode 235 exposed by the hole. In some example embodiments, a contact (not illustrated), a plug (not illustrated), or a pad (not illustrated) may be additionally disposed on the drain electrode 235 to fill the hole of the insulation layer 250. In this case, the first electrode 300 may be electrically connected to the drain electrode 235 through the pad, the plug, or the contact.

When the display device is a top emission type, the first electrode 300 may serve as a reflective electrode having a suitable reflectivity. In this case, the second electrode 500 may serve as a transparent electrode having a suitable transmittance or a transflective electrode that is semi-transparent. Materials in the first and the second electrodes 300 and 500 may vary in accordance with an emission type of the display device. For example, the first electrode 300 may serve as a transparent electrode or a transflective electrode, whereas the second electrode 500 may serve as a reflective electrode in case that the display device is a bottom emission type. Here, the term "reflective" may indicate an object having a reflectivity of about 70% to about 100% relative to an incident light, and the term "transflective" may indicate an object having a reflectivity of about 30% to about 70% with respect to an incident light. Further, the term "transparent" may indicate an object having a reflectivity of about 0% to about 30% with respect to an incident light.

In example embodiments, when the first electrode 300 serves as the reflective electrode, the first electrode 300 may include a metal and/or an alloy having a relatively high reflectivity. For example, the first electrode 300 may include silver (Ag), aluminum (Al), platinum (Pt), gold (Au), chrome (Cr), tungsten (W), molybdenum (Mo), titanium (Ti), palladium (Pa), an alloy thereof, etc. These may be used alone or in a combination thereof. Examples of the alloy in the first electrode 300 may include an ACA (Ag—Cu—Au) alloy, an APC (Ag—Pd—Cu) alloy, etc. In example embodiments, the first electrode 300 may have a single layer structure or a multi-layer structure including a metal film and/or an alloy film.

When the second electrode 500 serves as the transflective electrode, the second electrode 500 may include a single metal film. In this case, the second electrode 500 may have a set or predetermined reflectivity and a set or predetermined transmittance. When the second electrode 500 has a relatively large thickness, the display device may have relatively low luminance efficiency, so that the second electrode 500 should have a relatively thin thickness. For example, the second electrode 500 may have a thickness below about 30 nm. The second electrode 500 may include a metal and/or an alloy such as silver (Ag), aluminum (Al), platinum (Pt), gold (Au), chrome (Cr), tungsten (W), molybdenum (Mo), titanium (Ti), palladium (Pa), alloys of these metals, etc. These may be used alone or in a combination thereof.

In some example embodiments, the second electrode 500 may include a transparent conductive material, and thus the second electrode may serve as the transparent electrode. For example, the second electrode 500 may include an indium zinc oxide, an indium tin oxide, a gallium-tin oxide, a zinc oxide, a gallium oxide, a tin oxide, an indium oxide, etc. These may be used alone or in a combination thereof. The second electrode 500 may have a multi-layer structure including a plurality of the transparent films or a plurality of the transflective films having different reflective indices.

In example embodiments, the first electrode 300 may serve as an anode for providing holes into a first hole injection layer 410 of the light emitting structure 400. Here, the second electrode 500 may serve as a cathode for supplying electrons into an electron transfer layer 490. However, functions of the first and the second electrodes 300 and 500 may not be limited thereto, and roles of the first electrode 300 and the second electrode 500 may be modified in accordance with the emission type of the display device. A stacked construction (or configuration) having a hole transfer layer, an organic light emitting layer, and an electron transfer layer in the light emitting structure 400 may vary in accordance with the functions of the first electrode 300 and the second electrode 500.

In example embodiments, the display region of the display device may have the first sub-pixel region (I), the second sub-pixel region (II), and the third sub-pixel region (III) as illustrated in FIG. 1.

An optical distance controlling insulation layer 350 may be disposed on the first electrode 300 in the display region, and a protection layer 280 may be located on the insulation layer 250 in the non-display region adjacent to the display region. In example embodiments, the protection layer 280 may extend to partially cover the first electrode 300 that is electrically connected to the drain electrode 235. The protection layer 280 may include an oxide, a nitride, an oxynitride, an organic insulation material, etc. For example, the protection layer may include silicon oxide, silicon nitride, silicon oxy nitride, a benzocyclobutene-based resin, an olefin-based resin, a polyimide-based resin, an acryl-based resin, a polyvinyl-based resin, a siloxane-based resin, etc. These may be used alone or in a combination thereof. In some example embodiments, the display device may not include the protection layer 280, and thus the display device may have a simpler construction.

In example embodiments, the optical distance controlling insulation layer 350 may be positioned on the first electrode 300 in the first sub-pixel region (I) and the second sub-pixel region (II). In some example embodiments, the optical distance controlling insulation layer 350 may be located on the first electrode 300 in the first sub-pixel region (I), the second sub-pixel region (II), and the third sub-pixel region (III). In other example embodiments, the optical distance controlling insulation layer 350 may be disposed on the first electrode 300 located in at least one of the first sub-pixel region (I), the second sub-pixel region (II), or the third sub-pixel region (III).

The optical distance controlling insulation layer 350 may adjust or may ensure an optical resonance distance for generating optical resonances of light emitted from the light emitting structure 400. In example embodiments, the optical distance controlling insulation layer 350 may have various thicknesses substantially different in the first, the second, and the third sub-pixel regions (I, II, and III). For example, a first portion of the optical distance controlling insulation layer 350 in the first sub-pixel region (I) may have a thickness that is substantially larger than that of a second portion of the optical distance controlling insulation layer 350 in the second sub-pixel region (II). Distances between the first electrode 300 and the second electrode 500 in the first, the second, and the third sub-pixel regions (I, II, and III) may vary depending on the thickness difference of the optical distance controlling insulation layer 350 in the first, the second, and the third sub-pixel regions (I, II, and III).

The optical distance controlling insulation layer 350 may be substantially transparent. For example, the optical distance controlling insulation layer 350 may have a transmittance of about 70% to about 100% relative to an incident light. In example embodiments, the optical distance controlling insulation layer 350 may include a material that is substantially the same as or substantially similar to that of the first hole injection layer 410. In some example embodiments, the optical distance controlling insulation layer 350 may include a transparent insulation material. For example, the optical distance controlling insulation layer 350 may include a benzocyclobutene-based resin, an olefin-based resin, a polyimide-based resin, an acryl-based resin, a polyvinyl-based resin, a siloxane-based resin, etc. These may be used alone or in a combination thereof.

Generally, the term "optical resonance" or "microcavity effect" indicates the increase of luminance and/or intensity of light having a set or predetermined wavelength when an optical distance between two reflective or transflective faces satisfies the conditions of constructive interference of the light having the set or predetermined wavelength. The term "reflective" may indicate a reflectivity of about 70% to about 100% relative to an incident light, and the term "transflective" may indicate a reflectivity of about 30% to about 70% with respect to an incident light. Here, the optical distance may be substantially equal to a value obtained by multiplying the refraction index (n) of a layer and/or an electrode with the thickness (d) of the layer or the electrode when a light passes through a layer or an electrode. In the case that the light passes through a plurality of layers or electrodes having different refraction indices, the whole optical distance of the plurality of layers or electrodes may be substantially equal to the sum (Σn·d) of respective optical distance (n·d) of each layer or electrode.

When a plurality of layers or electrodes are disposed between the two reflective or transflective faces, the optical resonance of light between the two reflective or transflective faces may be represented by the following equation (1):

$$2\pi m = \sum_j \left( \frac{2\pi 2 n_j d_j}{\lambda} + \theta_j \right) \quad (1)$$

In the above equation (1), $n_j$ denotes an index of refraction of a $j^{th}$ layer or electrode among the plurality of layers or electrodes interposed between two reflective or transflective faces when a light having a set or predetermined wavelength ($\lambda$) passes through the $j^{th}$ layer or electrode. Additionally, $d_j$ indicates a thickness of the $j^{th}$ layer or electrode and m represents an arbitrary integer. Furthermore, $\theta_j$ represents a phase change of the light when the light passes the $j^{th}$ layer or electrode or the light is reflected from the reflective or transflective face. In the case that the above equation (1) is modified relative to an optical distance, the following equation (2) may be obtained from the above equation (1):

$$L = \sum_j n_j d_j = \frac{\lambda}{2}\left(m - \sum \frac{\theta_j}{2\pi}\right) = \frac{\lambda}{2}\left(m - \frac{\Phi}{2\pi}\right) \quad (2)$$

As for the above equation (2), L represents an optical distance for generating the optical resonance of the light having the set or predetermined wavelength ($\lambda$). Hereinafter, the optical distance suitable for the optical resonance of the light having the set or predetermined wavelength may be referred to as "an optical resonance distance (L)." Further, $\phi$ indicates the sum of phase changes of the light generated within the optical resonance distance (L). The sum of phase changes $\phi$ may be in a range of $-\pi$ radian to $\pi$ radian. The term "peak wavelength" refers to a wavelength of light that generates an optical resonance within a specific optical resonance distance (L).

According to the above equation (2), the optical resonance distance (L) for producing the optical resonance of the light having the set or predetermined wavelength ($\lambda$) may vary in accordance with the integer (m). In the case that the optical resonance distance (L) is relatively large, different integers (m) (i.e., the values of the above equation (2)) respectively corresponding to different peak wavelengths may be obtained within one optical resonance distance (L). For simplicity, the sum of the phase changes of the light generated within the optical resonance distance (L) is assumed to be zero, a peak wavelength of red light is assumed to be about 660 nm, and a peak wavelength of blue light is assumed to be about 440 nm. The optical resonance distance (L) that generates the optical resonance for red light may have several values of about 330 nm (m=1), about 660 nm (m=2), about 990 nm (m=3), about 1,320 nm (m=4), etc. The optical resonance distance (L) that generates the optical resonance for blue light may have several values of about 220 nm (m=1), about 440 nm (m=2), about 660 nm (m=3), about 880 nm (m=4), etc. That is, a plurality of optical resonance distances (L) may be obtained relative to one peak wavelength. However, the optical resonance distance may be limited by the size of the display device.

Referring now to FIG. 1, the first sub-pixel region (I) of the display device may be a region for mainly emitting red light, the second sub-pixel region (II) of the display device may be a region for mainly emitting green light, and the third sub-pixel region (III) of the display device may be a region for mainly emitting blue light. Therefore, a first optical resonance distance in the first sub-pixel region (I) may be adjusted to generate the optical resonance for red light, a second optical resonance distance in the second sub-pixel region (II) may be adjusted to generate the optical resonance for green light, and a third optical resonance distance in the third sub-pixel region (III) may be adjusted to generate the optical resonance for blue light.

In example embodiments, the first, the second, and the third optical resonance distances may be adjusted by controlling the thicknesses of the optical distance controlling insulation layer 350 and/or a refraction index of the optical distance controlling insulation layer 350. In the case that a thickness of the light emitting structure 400 in the first, the second, and the third sub-pixel regions (I, II, and III) is constant, the first, the second, and the third optical resonance distances may be adjusted by controlling the thickness and/or the refraction index of the optical distance controlling insulation layer 350.

As for the above equation (2), when m is constant, the optical resonance distance may increase in proportion to the peak wavelength. Therefore, the first optical resonance distance in the first sub-pixel region (I) for emitting red light may be substantially larger than the second optical resonance distance in the second sub-pixel region (II) for emitting green light. Further, the second optical resonance distance in the second sub-pixel region (II) may be substantially larger than the third optical resonance distance in the third sub-pixel region (III) for emitting blue light. Therefore, the optical distance controlling insulation layer 350 in the first sub-pixel region (I) may have a thickness substantially larger than that in the second sub-pixel region (II) or the third sub-pixel region (III).

In the display device in accordance with example embodiments, the first to the third sub-pixel regions (I, II, and III) may have substantially different optical resonance distances, so that different colors of light having different wavelengths may be emitted from the first to the third sub-pixel regions (I, II, and III), respectively. Therefore, the display device may have improved purity of colors of light, enhanced brightness, and increased color gamut of light, and the display device may have reduced driving voltage to extend a lifetime of the display device.

As illustrated in FIG. 1, the light emitting structure 400 including the optical distance controlling insulation layer 350 may be disposed on the first electrode 300. In example embodiments, the light emitting structure 400 may include the first hole injection layer 410, a hole transfer layer 420, a first organic light emitting layer 430, a blocking member 440, a charge generation layer 450, a second hole injection layer 460, a second organic light emitting layer 480, the electron transfer layer 490, etc.

In example embodiments, the first hole injection layer 410 may be disposed on the first electrode 300 to cover the optical distance controlling insulation layer 350. The first hole injection layer 410 may promote a hole injection from the first electrode 300 into the first organic light emitting layer 430. For example, the first hole injection layer 410 may include CuPc (cupper phthalocyanine), PEDOT (poly(3,4)-ethylenedioxythiophene), PANI (polyaniline), NPD (N,N-dinaphthyl-N,N'-diphenyl benzidine), etc. However, a material in the first hole injection layer 410 may not be limited thereto.

The hole transfer layer 420 may be located on the first hole injection layer 410. The hole transfer layer 420 may improve a movement of holes from the first hole injection layer 410. Here, when the highest occupied molecular energy (HOMO) of the hole transfer layer 420 is substantially lower than a work function of the first electrode 300, and is substantially higher than the highest occupied molecular energy (HOMO) of the first organic light emitting layer 430, an efficiency of the movement of holes may be optimized or improved. For example, the hole transfer layer 420 may include NPD (N, N-dinaphthyl-N, N'-diphenylbenzidine), TPD (N, N'-bis-(3-methylphenyl)-N, N'-bis-(phenyl)-benzidine), s-TAD, MTDATA (4,4',4''-Tris(N-3-methylphenyl-N-phenyl-amino)-triphenylamine), etc. However, a material in the hole transfer layer 420 may not be limited thereto.

The first organic light emitting layer 430 may be disposed on the hole transfer layer 420. The first organic light emitting layer 430 may include a blue fluorescent dopant or a blue phosphorescent dopant dispersed in a host. In example embodiments, the first organic light emitting layer 430 may substantially emit blue light, and thus color stability thereof may be improved, and a life time of the first organic light emitting layer 430 may be extended.

The charge generation layer 450 may be disposed on the first organic light emitting layer 430. The charge generation layer 450 may serve as an anode for the first organic light emitting layer 430 and also may serve as a cathode for the second organic light emitting layer 480.

The charge generation layer 450 may have a single layer structure or a multi-layer structure. In example embodiments, the charge generation layer 450 may have the single layer structure including a metal oxide film containing a vanadium oxide (VOx), a tungsten oxide (WOx), etc. In some example embodiments, the charge generation layer 450 may have a double layer structure including a metal oxide film and a metal film. In this case, the metal oxide film may include a vanadium oxide (VOx), a tungsten oxide (WOx), etc. Further, the metal film may include aluminum, silver, etc.

When a voltage is applied to the first electrode 300 and/or the second electrode 500, charges (e.g., electrons or holes) may be generated in the charge generation layer 450, and the generated charges (electrons or holes) may be supplied from the charge generation layer 450 to the adjacent first organic light emitting layer 430 and/or the adjacent second organic light emitting layer 480. Therefore, distribution of the charges may be substantially uniform in the first, the second, and the third sub-pixel regions (I, II and III), so that the red, the green, and the blue lights may be substantially uniformly emitted. Further, the display device including a plurality of organic light emitting layers may have enhanced luminance efficiency that is larger than that of a display device including a single organic light emitting layer.

In some example embodiments, in order to reduce the driving voltage and to increase the luminance efficiency, an additional electron transfer layer (not illustrated) and/or an electron injection layer (not illustrated) may be disposed between the first organic light emitting layer 430 and the charge generation layer 450.

The second hole injection layer 460 may be positioned on the charge generation layer 450. The second hole injection layer 460 may be substantially the same as or substantially similar to the first hole injection layer 410 in the aspects of the role and the material.

The second organic light emitting layer 480 may be disposed on the second hole injection layer 460. The second organic light emitting layer 480 may have a single layer structure or a multi-layer structure. In example embodiments, the second organic light emitting layer 480 may have a double layer structure including a green light-emitting film and a red light-emitting film. The green light-emitting film may include a green dopant dispersed in a host, and the red light-emitting film may include a red dopant dispersed in a host. In some example embodiments, the second organic light emitting layer 480 may have the single layer structure including a green dopant and a red dopant dispersed in a host.

The electron transfer layer 490 may be disposed on the second organic light emitting layer 480. The electron transfer layer 490 may enhance a movement of electrons to the second organic light emitting layer 480. For example, the electron transfer layer 490 may include (tris(8-hydroxyquinolino)aluminum), PBD, TAZ, spiro-PBD, BAlq, SAlq, etc. However, a material in the electron transfer layer 490 may not be limited thereto.

In some example embodiments, in order to reduce the driving voltage and to increase the luminance efficiency, an additional hole transfer layer (not illustrated) may be located between the second hole injection layer 460 and the second organic light emitting layer 480. Further, an additional electron injection layer (not illustrated) may be disposed between the electron transfer layer 490 and the second electrode 500.

As illustrated in FIG. 1, the blocking member 440 may be disposed on the first organic light emitting layer 430 in the first sub-pixel region (I). In example embodiments, the blocking member 440 may prevent or reduce a movement of electrons. In this case, the blocking member 440 may include fullerene, a polymer including substituted triarylamine, a carbazole based polymer, 1,1-Bis(4-(N,N-di-p-tolylamino)phenyl)cyclohexane (TAPC), 1,1-Bis(4-(N,N-di-p-tolylamino)phenyl)cyclopentane, 4,4'-(9H-fluoren-9-ylidene)bis[N,N-bis(4-methylphenyl)-benzenamine, 1,1-Bis(4-(N,N-di-p-tolylamino)phenyl)-4-phenylcyclohexane, 1,1-Bis(4-(N,N-di-p-tolylamino)phenyl)-4-methylcyclohexane, 1,1-Bis(4-(N,N-di-p-tolylamino)phenyl)-3-phenylpropane, Bis[4-(N, N-diethylamino)-2-methylphenyl](4-methylphenyl)methane, Bis[4-(N,N-diethylamino)-2-methylphenyl](4-methylphenyl)ethane, 4-(4-Diethylaminophenyl)triphenylmethane, 4,4'-Bis(4-diethylaminophenyl)diphenylmethane, N,N-bis[2,5-dimethyl-4-[(3-methylphenyl)phenylamino]phenyl]-2,5-dimethyl-N'-(3-methy (phenyl)-N'-phenyl-1,4-benzenediamine, 4-(9H-carbazol-9-yl)-N,N-bis[4-(9H-carbazol-9-yl)phenyl]-benzenamine (TCTA), 4-(3-phenyl-9H-carbazol-9-yl)-N,N-bis[4(3-phenyl-9H-carbazol-9-yl) phenyl]-benzenamine, 9,9'-(2,2'-dimethyl[1,1'-biphenyl]-4, 4'-diyl)bis-9H-carbazole (CDBP), 9,9'[1,1'-biphenyl]-4,4'- diyl)bis-9H-carbazole (CBP), 9,9'-(1,3-phenylene)bis-9H-carbazole (mCP), 9,9'-(1,4-phenylene)bis-9H-carbazole, 9,9',9"-(1,3,5-benzenetriyl)tris-9H-carbazole, 9,9'-(1,4-phenylene)bis[N,N,N',N'-tetraphenyl-9H-carbazole-3,6-diamine, 9-[4-(9H-carbazol-9-yl)phenyl]-N,N-diphenyl-9H-carbazol-3-amine, 9,9'-(1,4-phenylene)bis[N,N-diphenyl-9H-carbazol-3-amine, 9-[4-(9H-carbazol-9-yl)phenyl]-N,N,N',N'-tetraphenyl-9H-carbazole-3,6-diamine, 9-phenyl-9H-carbazol, etc. Further, the blocking member 440 may have a thickness of about 30 nm or more to effectively prevent or reduce the movement of electrons. For example, the blocking member 440 may have a thickness between about 30 nm and about 150 nm. In some example embodiments, the blocking member 440 may include a material having a relatively large highest occupied molecular energy (HOMO) and may be transparent.

In example embodiments, the blocking member 440 may prevent or reduce the movement of electrons from the charge generation layer 450 to the first organic light emitting layer 430 in the first sub-pixel region (I). Therefore, the electrons may not be supplied to the first organic light emitting layer 430 in the first sub-pixel region (I) because of the blocking member 440, so that the first organic light emitting layer 430 in the first sub-pixel region (I) may not substantially emit light.

In the display device described with reference to FIG. 1, the optical distance controlling insulation layer 350 may have substantially different thicknesses in the first sub-pixel region (I) and the second sub-pixel region (II). However the optical distance controlling insulation layer 350 may not be limited thereto. For example, the optical distance controlling insulation layer 350 may have a substantially uniform thickness in the first sub-pixel region (I) and the second sub-pixel region (II). In this case, the first and the second optical resonance distances of the first and the second sub-pixel regions (I and II) may be adjusted by controlling a thickness of the blocking member 440.

Figure 2:
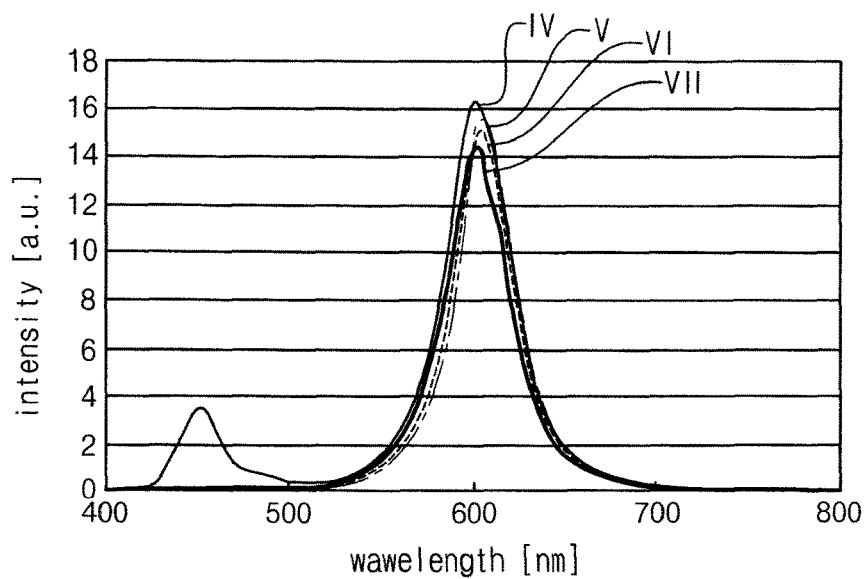
FIG. 2 is a graph showing peak wavelengths of optical resonances of red light and blue light depending on a thickness of an electron blocking layer.

FIG. 2 is a graph showing peak wavelengths of optical resonances of red light and blue light depending on a thickness of an electron blocking layer.

Referring to FIG. 2, as for a display device (IV) which does not include a blocking member such as an electron blocking layer, when an optical resonance distance is adjusted to generate an optical resonance for red light, an optical resonance for blue light occurs concurrently (e.g., simultaneously). As described above, the optical resonance distance for generating the optical resonance for the red light (m=2) may have a value of about 660 nm that is substantially similar to that for blue light (m=3), so that the optical resonances for red light and blue light are generated concurrently (e.g., simultaneously) in the display device (IV), thereby reducing purity of colors of light of the display device (IV). As for a display device (V) including an electron blocking layer having a thickness of about 30 nm, a display device (VI) including an electron blocking layer having a thickness of about 50 nm, and a display device (VII) including an electron blocking layer having a thickness of about 100 nm, an optical resonance for red light is generated without causing an optical resonance for blue light. Therefore, purity of colors of light in the display device may be improved by applying the blocking member such as the electron blocking layer.

Referring to FIGS. 1 and 2, when the blocking member 440 is disposed between the first organic light emitting layer 430 and the charge generation layer 450 in the first sub-pixel region (I), the blocking member 440 may block the movement of electrons from the charge generation layer 450 to the first organic light emitting layer 430. That is, excitons may not be generated in the first organic light emitting layer 430 in the first sub-pixel region (I) because of the blocking member 440, so that emission of blue light may be prevented or reduced by the blocking member 440. Therefore, substantially only red light may be emitted by the optical resonance in the first sub-pixel region (I), light having a high color purity may be emitted in the first, the second, and the third sub-pixel regions (I, II, and III), and the display device may ensure high purity of light colors and high brightness without a color filter. As a result, a constitution of the display device may be simplified, manufacturing costs thereof may be reduced, and manufacturing processes may be simplified. Further, a color filter is not used over the organic light emitting layers, so that a reduction in the brightness caused by the color filter may be prevented.

Figure 3:
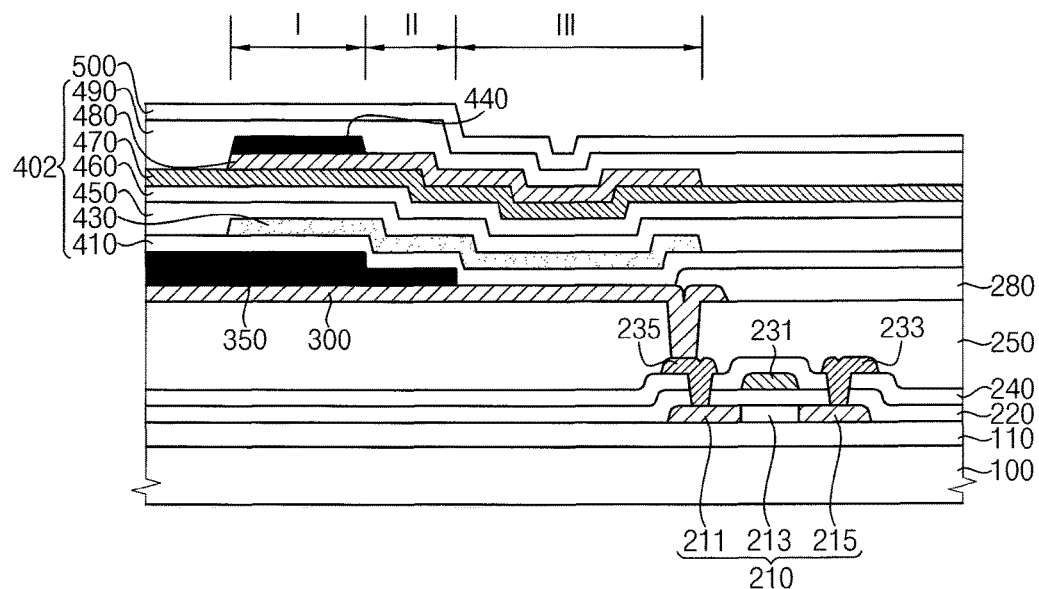
FIG. 3 is a cross-sectional view illustrating a display device having a light emitting structure in accordance with some example embodiments.

FIG. 3 is a cross-sectional view illustrating a display device having a light emitting structure in accordance with some example embodiments. The display device illustrated in FIG. 3 may have a construction substantially the same as or substantially similar to that of the display device described with reference to FIG. 1, except for a light emitting structure.

Referring to FIG. 3, the display device may include a substrate 100, a switching structure, a first electrode 300, a light emitting structure 402, a second electrode 500, etc. A display region of the display device may be divided into first, second, and third sub-pixel regions (I, II, and III), and thus the light emitting structure 402 may be divided into the first, the second, and the third sub-pixel regions (I, II, and III).

The switching structure including a switching device and at least one or more insulation layers may be disposed on the substrate 100 having a buffer layer 110. The switching structure may include a semiconductor layer 210, a gate insulation layer 220, a gate electrode 231, an insulating interlayer 240, a source electrode 233, a drain electrode 235, an insulation layer 250, etc. In this case, the semiconductor layer 210 may include a first impurity region 211, a channel region 213, and a second impurity region 215. A construction of the switching structure may be substantially the same as or substantially similar to that of the switching structure described with reference to FIG. 1.

The first electrode 300 may be disposed on the insulation layer 250 in the display region, and a protection layer 280 may be disposed on the insulation layer 250 in a non-display region adjacent to the display region. The second electrode 500 may be located above the first electrode 300, and the first and second electrodes 300 and 500 are on opposite sides of the light emitting structure 402. An optical distance controlling insulation layer 350 and the light emitting structure 402 may be disposed between the first electrode 300 and the second electrode 500.

The optical distance controlling insulation layer 350 may be disposed on the first electrode 300 in the display region. In example embodiments, the optical distance controlling insulation layer 350 may be disposed only in the first sub-pixel region (I) and the second sub-pixel region (II). In some example embodiments, the optical distance controlling insulation layer 350 may be positioned in the first sub-pixel region (I), the second sub-pixel region (II), and the third sub-pixel region (III). The optical distance controlling insulation layer 350 may have substantially different thicknesses in the first, the second, and the third sub-pixel regions (I, II, and III), and thus gaps (or distances) between the first electrode 300 and the second electrode 500 may be substantially different in the first, the second, and the third sub-pixel regions (I, II, and III), thereby generating optical resonances for different wavelengths of lights with different colors.

A first hole injection layer 410 of the light emitting structure 402 may be disposed on the first electrode 300 to cover the optical distance controlling insulation layer 350. The first hole injection layer 410 may improve a hole injection from the first electrode 300 to a first organic light emitting layer 430. The first organic light emitting layer 430 may be disposed on the first hole injection layer 410. The first organic light emitting layer 430 may have a single layer structure or a double layer structure. In example embodiments, the second organic light emitting layer 480 may have the double layer structure including a green light emitting film and a red light emitting film. The green light emitting film may include a green dopant dispersed in a host, and the red light emitting layer may include a red dopant dispersed in a host. In some example embodiments, the second organic light emitting layer 480 may have the single layer structure including a green dopant and a red dopant dispersed in a host.

A charge generation layer 450 may be disposed on the first organic light emitting layer 430. The charge generation layer 450 may serve as an anode for the first organic light emitting layer 430, and may serve as a cathode for a second organic light emitting layer 480. The charge generation layer 450 may have a single layer structure or a multi-layer structure. A second hole injection layer 460 and a hole transfer layer 470 may be located on the charge generation layer 450 to enhance a movement of holes from the charge generation layer 450 to the second organic light emitting layer 480.

The second organic light emitting layer 480 may be disposed on the hole transfer layer 470. For example, the second organic light emitting layer 480 may include a blue light emitting film including a blue dopant dispersed in a host. An electron transfer layer 490 may be disposed on the second organic light emitting layer 480 to improve a movement of electrons.

In example embodiments, a blocking member 440 may include an electron blocking layer. In this case, the electron blocking layer may be disposed between the second organic light emitting layer 480 and the electron transfer layer 490 in the first sub-pixel region (I). The blocking member 440 including the electron blocking layer may prevent or reduce the movement of electrons from the electron transfer layer 490 to the second organic light emitting layer 480. Therefore, electrons may not be supplied to the second organic light emitting layer 480 in the first sub-pixel region (I) because of the blocking member 440, so that the second organic light emitting layer 480 in the first sub-pixel region (I) may not emit light.

In comparison with the display device described with FIG. 1, the display device with reference to FIG. 3 may include the light emitting structure 402 where the blue light emitting film may change positions with the red and the green light emitting films, and positions of the blocking member 440 and the hole transfer layer 470 may also change. Even though there may be a position change, each optical resonances may be generated in the first, the second, and the third sub-pixel regions (I, II, and III), and emission of blue light may be prevented or reduced by the blocking member 440 in the first sub-pixel region (I), so that the display device may ensure high purity of colors of light, improved color gamut of light, and high brightness without a color filter.

Figure 4:
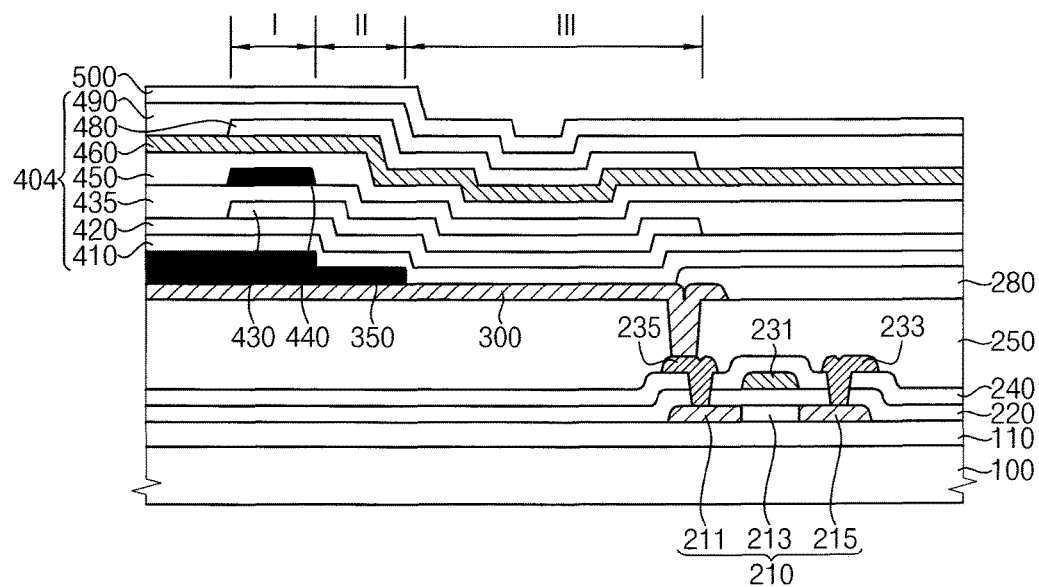
FIG. 4 is a cross-sectional view illustrating a display device having a light emitting structure in accordance with some example embodiments.

FIG. 4 is a cross-sectional view illustrating a display device having a light emitting structure in accordance with some example embodiments. The display device illustrated in FIG. 4 may have a construction substantially the same as or substantially similar to that of the display device described with reference to FIG. 1, except for a light emitting structure.

Referring to FIG. 4, the display device may include a substrate 100, a switching structure, a first electrode 300, a light emitting structure 404, a second electrode 500, etc. The display device may include a non-display region and a display region divided into first, second, and third sub-pixel regions (I, II, and III), and thus the light emitting structure 404 in the display region may be divided into the first, the second, and the third sub-pixel regions (I, II, and III).

A buffer layer 110 may be disposed on the substrate 100, and the switching structure may be disposed on the buffer layer 110. The switching structure may include a semiconductor layer 210 (including a first impurity region 211, a channel region 213, and a second impurity region 215), a gate insulation layer 220, a gate electrode 231, an insulating interlayer 240, a source electrode 233, a drain electrode 235, an insulation layer 250, etc. A construction of the switching structure has been described in detail with reference to FIG. 1, so that any further descriptions will be omitted.

In example embodiments, an optical distance controlling insulation layer 350 may be disposed on the first electrode 300. In example embodiments, the optical distance controlling insulation layer 350 may be positioned only in the first sub-pixel region (I) and the second sub-pixel region (II). In some example embodiments, the optical distance controlling insulation layer 350 may be disposed in the first sub-pixel region (I), the second sub-pixel region (II), and the third sub-pixel region (III). The optical distance controlling insulation layer 350 may have substantially different thicknesses in the first, the second, and the third sub-pixel regions (I, II, and III), and thus gaps between the first electrode 300 and the second electrode 500 may be substantially different in the first, the second, and the third sub-pixel regions (I, II, and III), thereby generating the optical resonances for different wavelengths of color lights.

The light emitting structure 404 in the display region may include a first hole injection layer 410, a hole transfer layer 420, a first organic light emitting layer 430, an additional electron transfer layer 435, a blocking member 440, a charge generation layer 450, a second hole injection layer 460, a second organic light emitting layer 480, an electron transfer layer 490, etc. The light emitting structure 404 may have a constitution substantially the same as or substantially similar to that of the light emitting structure 400 described with reference to FIG. 1.

In example embodiments, the additional electron transfer layer 435 may be disposed between the first organic light emitting layer 430 and the charge generation layer 450. The additional electron transfer layer 435 may enhance a movement of electrons from the charge generation layer 450 to the first organic light emitting layer 430, and thus luminance efficiency of the light emitting structure 404 may be improved. The blocking member 440 may include an electron blocking layer. In this case, the electron blocking layer may be disposed on the additional electron transfer layer 435 in the first sub-pixel region (I). The blocking member 440 may block the movement of electrons from the charge generation layer 450 to the first organic light emitting layer 430 in the first sub-pixel region (I). Therefore, the electrons may not be supplied to the first organic light emitting layer 430 in the first sub-pixel region (I) because of the blocking member 440, so that the first organic light emitting layer 430 in the first sub-pixel region (I) may not emit light. In some example embodiments, a hole blocking layer (not illustrated) instead of the additional electron transfer layer 435 may be disposed between the first organic light emitting layer 430 and the charge generation layer 450. The hole blocking layer may block a movement of holes from the first organic light emitting layer 430 to the charge generation layer 450, thereby improving the luminance efficiency of the light emitting structure 404.

In comparison with the display device described with FIG. 1, the display device with reference to FIG. 4 includes the light emitting structure 404 where the blocking member 440 may be separated from the first organic light emitting layer 430 including the blue light-emitting film. Even though there may be a position change, a movement of electrons to the blue light-emitting film may be blocked or reduced by the blocking member 440, so that substantially only red light may be emitted in the first sub-pixel region (I). Therefore, the display device may ensure high purity of colors of light, improved color gamut of light, and high brightness without a color filter.

Figure 5:
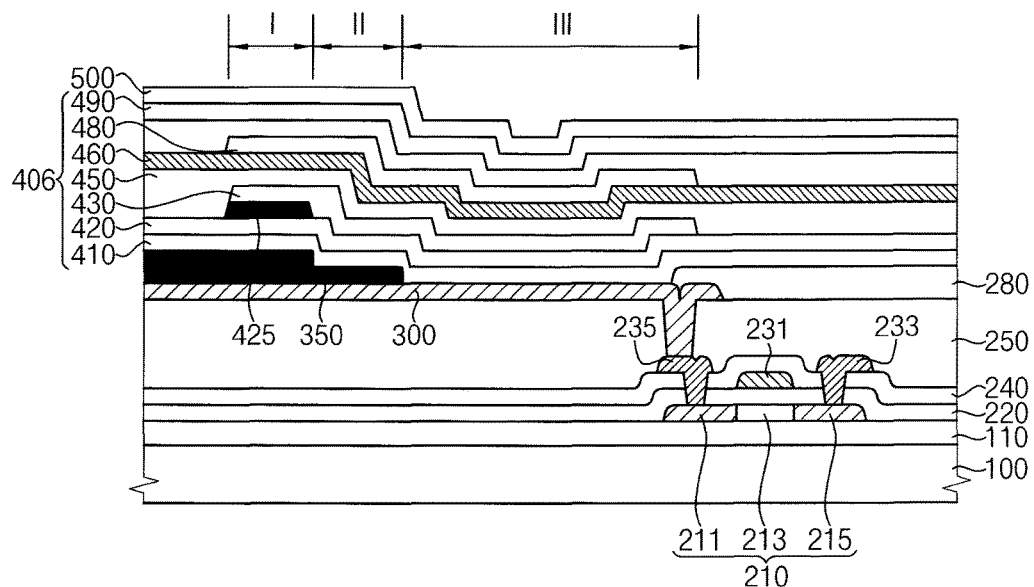
FIG. 5 is a cross-sectional view illustrating a display device having a light emitting structure in accordance with some example embodiments.

FIG. 5 is a cross-sectional view illustrating a display device having a light emitting structure in accordance with some example embodiments. The display device illustrated in FIG. 5 may have a construction substantially the same as or substantially similar to that of the display device described with reference to FIG. 1, except for a light emitting structure.

Referring to FIG. 5, the display device may include a substrate 100, a switching structure, a first electrode 300, a light emitting structure 406, a second electrode 500, etc. The display device and the light emitting structure 406 may include first, second, and third sub-pixel regions (I, II, and III).

The switching structure may include one or more insulation layers and a switching device. For example, the switching structure may include a semiconductor layer 210 (having a channel region 213, a first impurity region 211, and a second impurity region 215), a gate insulation layer 220, a gate electrode 231, a source electrode 233, a drain electrode 235, etc. Further, the one or more insulation layers may include an insulating interlayer 240, an insulation layer 250, etc.

In example embodiments, an optical distance controlling insulation layer 350 may be disposed on the first electrode 300 in a display region of the display device. The optical distance controlling insulation layer 350 may be disposed in the first sub-pixel region (I), the second sub-pixel region (II), and/or the third sub-pixel region (III). In this case, the optical distance controlling insulation layer 350 may have substantially different thicknesses in the first, the second, and the third sub-pixel regions (I, II, and III). Therefore, first, second, and third optical resonance distances may be provided between the first electrode 300 and the second electrode 500 in the first, the second, and the third sub-pixel regions (I, II, and III), respectively.

In example embodiments, the light emitting structure 406 may include a first hole injection layer 410, a hole transfer layer 420, a blocking member 425, a first organic light emitting layer 430, a charge generation layer 450, a second hole injection layer 460, a second organic light emitting layer 480, an electron transfer layer 490, etc. The blocking member 425 including an exciton quenching layer (EQL) may be disposed between the first organic light emitting layer 430 and the hole transfer layer 420 in the first sub-pixel region of the light emitting structure 406. In this case, the exciton quenching layer of the blocking member 425 may include fullerene, a polymer including substituted triarylamine, a carbazole based polymer, 1,1-Bis(4-(N,N-di-p-tolylamino)phenyl)cyclohexane (TAPC), 1,1-Bis(4-(N,N-di-p-tolylamino)phenyl)cyclopentane, 4,4'-(9H-fluoren-9-ylidene)bis[N,N-bis(4-methylphenyl)-benzenamine, 1,1-Bis(4-(N,N-di-p-tolylamino)phenyl)-4-phenylcyclohexane, 1,1-Bis(4-(N,N-di-p-tolylamino)phenyl)-4-methylcyclohexane, 1,1-Bis(4-(N,N-di-p-tolylamino)phenyl)-3-phenylpropane, Bis[4-(N,N-diethylamino)-2-methylphenyl](4-methylphenyl)methane, Bis[4-(N, N-diethylamino)-2-methylphenyl](4-methylphenyl)ethane, 4-(4-Diethylaminophenyl)triphenylmethane, 4,4'-Bis(4-diethylaminophenyl)diphenylmethane, N,N-bis[2,5-dimethyl-4-[(3-methylphenyl)phenylamino]phenyl]-2,5-dimethyl-N'-(3-methy (phenyl)-N'-phenyl-1,4-benzenediamine, 4-(9H-carbazol-9-yl)-N,N-bis[4-(9H-carbazol-9-yl)phenyl]-benzenamine (TCTA), 4-(3-phenyl-9H-carbazol-9-yl)-N,N-bis[4(3-phenyl-9H-carbazol-9-yl)phenyl]-benzenamine, 9,9'-(2,2'-dimethyl[1,1'-biphenyl]-4,4'-diyl)bis-9H-carbazole (CDBP), 9,9'[1,1'-biphenyl]-4,4'-diyl)bis-9H-carbazole (CBP), 9,9'-(1,3-phenylene)bis-9H-carbazole (mCP), 9,9'-(1,4-phenylene)bis-9H-carbazole, 9,9',9"-(1,3,5-benzenetriyl)tris-9H-carbazole, 9,9'-(1,4-phenylene)bis[N,N,N',N'-tetraphenyl-9H-carbazole-3,6-diamine, 9-[4-(9H-carbazol-9-yl)phenyl]-N,N-diphenyl-9H-carbazol-3-amine, 9,9'-(1,4-phenylene)bis[N,N-diphenyl-9H-carbazol-3-amine, 9-[4-(9H-carbazol-9-yl)phenyl]-N,N, N',N'-tetraphenyl-9H-carbazole-3,6-diamine, 9-phenyl-9H-carbazol, etc. When operating the display device, electrons and holes may collide with each other between the first organic light emitting layer 430 and the hole transfer layer 420 to generate excitons. The blocking member 425 including the exciton quenching layer may transform high energy electrons or excitons near the exciton quenching layer to low energy electrons or excitons. Therefore, the electrons or the excitons which may participate in the light emitting process may not exist, so that the first organic light emitting layer 430 may not emit light.

In comparison with the display device described with FIG. 1, the display device with reference to FIG. 5 may include the blocking member 425 having the exciton quenching layer instead of an electron blocking layer in the first sub-pixel region. Even though there may be a position change, substantially only red light may be emitted in the first sub-pixel region (I), and emission of blue light may be prevented or reduced.

Figure 6:
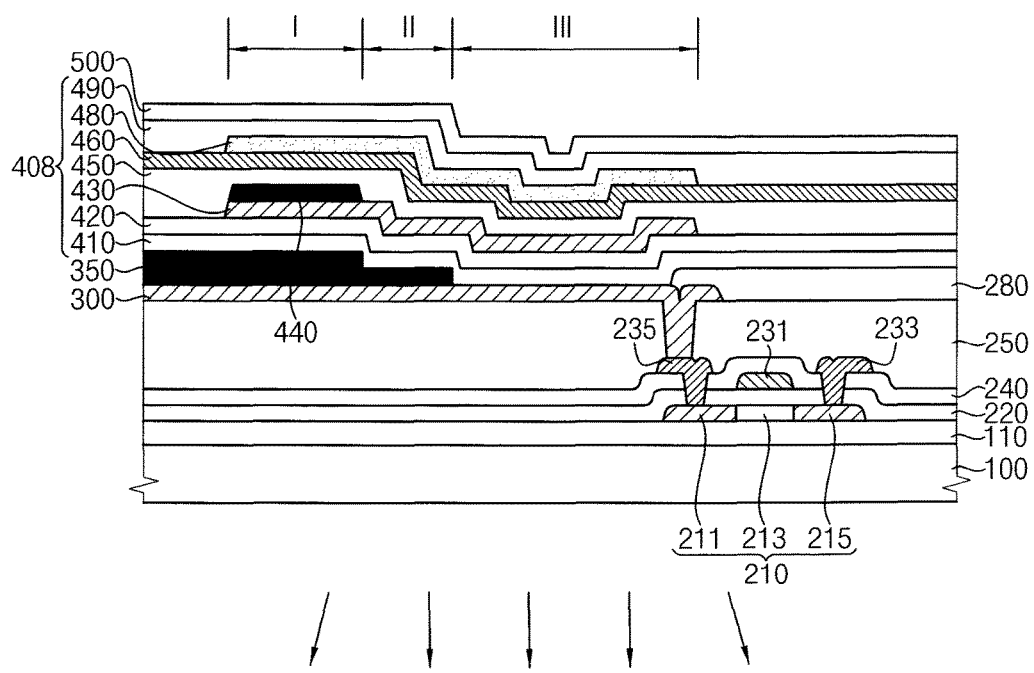
FIG. 6 is a cross-sectional view illustrating a display device having a light emitting structure in accordance with some example embodiments.

FIG. 6 is a cross-sectional view illustrating a display device having a light emitting structure in accordance with some example embodiments. The display device illustrated in FIG. 6 may have a construction substantially the same as or substantially similar to that of the display device described with reference to FIG. 1 except for a first electrode 300, a second electrode 500, and an emission type.

Referring to FIG. 6, the display device may include a substrate 100, a switching structure, the first electrode 300, a light emitting structure 408, the second electrode 500, etc.

The switching structure may be disposed on the substrate 100 having a buffer layer 110. The switching structure may include a switching device and one or more insulation layers. The switching device may include a semiconductor layer 210, a gate insulation layer 220, a gate electrode 231, a source electrode 233, a drain electrode 235, etc. The one or more insulation layers may include an insulating interlayer 240, an insulation layer 250, etc.

In example embodiments, when the display device is a bottom emission type, the first electrode 300 may serve as a transflective electrode having a reflectivity of about 30% to about 70% with respect to an incident light, and the second electrode 500 may serve as a reflective electrode having a reflectivity of about 70% to about 100% relative to an incident light.

When the first electrode 300 is a transflective electrode, the first electrode 300 may include a metal, an alloy, a conductive metal oxide, a transparent inorganic material doped with impurities, etc. For example, the first electrode 300 may have a multi-layer structure including a plurality of the transparent films or a plurality of the transflective films having different reflective indices. In example embodiments, the first electrode 300 may have a triple layer structure including a first electrode film, a second electrode film, and a third electrode film. In this case, the first electrode film and the third electrode film may include a metal oxide containing an indium tin oxide, an indium zinc oxide, a zinc oxide, etc. The second electrode film may include a magnesium-silver alloy, silver, a silver-palladium-copper alloy, etc. Even though the second electrode film may include a metal having a relatively high reflectivity, the second electrode film may have a relatively thin thickness, thereby serving as a transflective electrode.

When the second electrode 500 is the reflective electrode, the second electrode 500 may include aluminum, platinum, silver, gold, chromium, tungsten, molybdenum, titanium, palladium, and alloys of these metals (e.g., Ag—Cu—Au (ACA) alloy or Ag—Pd—Cu (APC) alloy), etc. These materials may be used alone or in a combination thereof. When the second electrode 500 is the reflective electrode, a light generated in the light emitting structure 408 may pass through the first electrode 300 and the substrate 100, such that the display device is a bottom emission type. In example embodiments, an optical distance controlling insulation layer 350 may be disposed on the first electrode 300 in the first sub-pixel region (I), the second sub-pixel region (II), and/or the third sub-pixel region (III). In this case, the optical distance controlling insulation layer 350 may have substantially different thicknesses in the first, the second, and the third sub-pixel regions (I, II, and III). Therefore, first, second, and third optical resonance distances may be formed between the first electrode 300 and the second electrode 500 in the first, the second, and the third sub-pixel regions (I, II, and III), respectively.

The light emitting structure 408 of the display device may include a first hole injection layer 410, a hole transfer layer 420, a first organic light emitting layer 430, a blocking member 440, a charge generation layer 450, a second hole injection layer 460, a second organic light emitting layer 480, an electron transfer layer 490, etc. The light emitting structure 408 may have a constitution substantially the same as or substantially similar to that of the light emitting structure 400 described with reference to FIG. 1.

In example embodiments, the blocking member 440 may include an electron blocking layer. The electron blocking layer may be disposed between the charge generation layer 450 and the first organic light emitting layer 430 in the first sub-pixel region (I). The blocking member 440 may block a movement of electrons from the charge generation layer 450 to the first organic light emitting layer 430 in the first sub-pixel region (I). The electrons may not be supplied to the first organic light emitting layer 430 in the first sub-pixel region (I) because of the blocking member 440, so that the first organic light emitting layer 430 in the first sub-pixel region (I) may not emit light.

In comparison with the display device described with FIG. 1, the display device with reference to FIG. 6 may be changed into a bottom emission type depending on a material change of the first electrode 300 and the second electrode 500. Even though there may be a position change of the first electrode 300 and the second electrode 500, first, second, and third optical resonances may be generated in the first, the second, and the third sub-pixel regions (I, II, and III), and emission of blue light may be prevented or reduced by the blocking member 440 in the first sub-pixel region so that the display device may ensure high purity of colors of light, improved color gamut of light, and high brightness without a color filter.

FIGS. 7 to 14 are cross-sectional views illustrating a method of manufacturing a display device having a light emitting structure in accordance with example embodiments. The display device obtained by the method illustrated in FIGS. 7 to 14 may have a construction substantially the same as or substantially similar to that of the display device described with reference to FIG. 1. However, those ordinary skilled in the art will understand that the method according to example embodiments may be properly and easily modified to manufacture one of the liquid crystal display devices described with reference to FIGS. 3 to 6.

Figure 7:
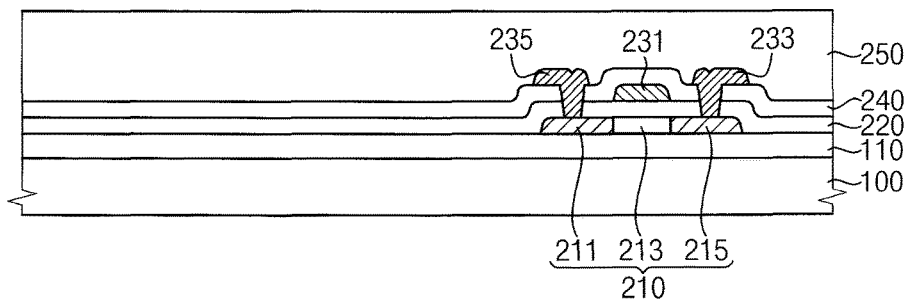
FIGS. 7 to 14 are cross-sectional views illustrating a method of manufacturing a display device having a light emitting structure in accordance with example embodiments.

Referring to FIG. 7, a buffer layer 110 may be formed on a substrate 100. The substrate 100 may be formed using a transparent insulation material. The buffer layer 110 may be formed using an oxide, a nitride, an oxynitride, an organic insulation material, etc. These may be used alone or in a combination thereof. The buffer layer 110 may be formed on the substrate 100 by a chemical vapor deposition (CVD) process, a plasma enhanced chemical vapor deposition (PECVD) process, a high density plasma-chemical vapor deposition (HDP-CVD) process, a spin coating process, a thermal oxidation process, a printing process, etc.

A switching structure may be formed on the buffer layer 110. In example embodiments, after forming a semiconductor layer 210 on the buffer layer 110, a gate insulation layer 220 may be formed on the buffer layer 110 to cover the semiconductor layer 210. The semiconductor layer 210 may be formed using silicon by a chemical vapor deposition process, a plasma enhanced chemical vapor deposition process, a high density plasma chemical vapor deposition process, a spin coating process, a thermal oxidation process, a printing process, etc. The gate insulation layer 220 may be formed using an oxide, an organic insulation material, etc. In this case, the gate insulation layer 220 may be conformally formed along a profile of the semiconductor layer 210. The gate insulation layer 220 may be formed by a sputtering process, a chemical vapor deposition process, an atomic layer deposition process, a high density plasma-chemical vapor deposition process, a spin coating process, a printing process, etc.

A gate electrode 231 may be formed on the gate insulation layer 220 under which the semiconductor layer 210 may be located. The gate electrode 231 may be formed using a metal, a metal nitride, a conductive metal oxide, a transparent conductive material, etc. Further, the gate electrode 231 may be formed by a sputtering process, a chemical vapor deposition process, an atomic layer deposition (ALD) process, a spin coating process, a vacuum evaporation process, a pulsed laser deposition (PLD) process, a printing process, etc. Impurities may be doped into the semiconductor layer 210 using the gate electrode 220 as an implantation mask, so that a first impurity region 211 and a second impurity region 215 may be formed at lateral portions of the semiconductor layer 210, respectively. Therefore, a central portion of the semiconductor layer 210 may be defined as a channel region 213. For example, the first and the second impurity regions 211 and 215 may be formed by an ion implantation process. In example embodiments, while forming the gate electrode 231, a gate line (not illustrated) may be formed on the gate insulation layer 220. The gate line may extend on the gate insulation layer 220 to contact the gate electrode 231.

An insulating interlayer 240 may be formed on the gate insulation layer 220 to cover the gate electrode 231. The insulating interlayer 240 may be formed using an oxide, a nitride, an oxynitride, an organic insulation material, etc. The insulating interlayer 240 may be formed by a sputtering process, a chemical vapor deposition process, a plasma enhanced chemical vapor deposition process, an atomic layer deposition process, a spin coating process, a vapor deposition process, a pulsed laser deposition process, a printing process, etc. A source electrode 233 and a drain electrode 235 may be connected to the first impurity region 211 and the second impurity region 215, respectively. In example embodiments, a data line (not illustrated) may be formed on the insulating interlayer 240. The data line may be formed together with the source electrode 233 and the drain electrode 235. The data line may extend on the insulating interlayer 240 to contact the source electrode 233.

In the switching device illustrated in FIG. 7, the switching device may have a top gate structure in which the gate electrode 231 is disposed over the semiconductor layer 210, however, the scope of example embodiments of the present invention is not limited to such a structure. For example, the switching device may have a bottom gate structure including a gate electrode located below a semiconductor layer or an oxide semiconductor device including a semiconductor oxide layer serving as an active layer.

Referring now to FIG. 7, an insulation layer 250 may be formed on the substrate 100 to cover the switching device, so that the switching structure including the switching device and the insulation layer 250 may be formed on the substrate 100. The insulation layer 250 may be formed using a transparent insulation material such as a transparent plastic, a transparent resin, etc. Further, the insulation layer 250 may be formed by a spin coating process, a printing process, a vacuum evaporation process, etc. In example embodiments, an upper portion of the insulation layer 250 may be partially removed by a planarization process such as a chemical mechanical polishing process and/or an etch-back process. In some example embodiments, the insulation layer 250 may be formed using a material having a self planarizing property, and thus the insulation layer 250 may have a substantially flat upper face or surface.

Figure 8:
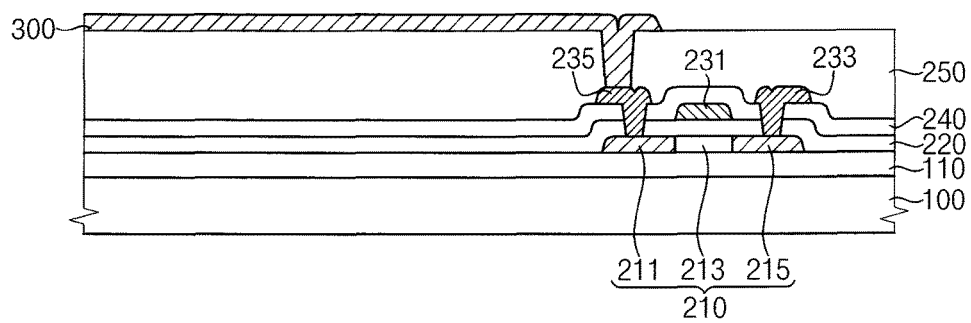

Referring to FIG. 8, the insulation layer 250 may be partially removed to form a hole (not illustrated) that may partially expose the drain electrode 235. For example, the hole through the insulation layer 250 may be obtained by a photolithography process. In example embodiments, after a first conductive layer (not illustrated) filling the hole of the insulation layer 250 is formed on the insulation layer 250, the first conductive layer may be patterned to form the first electrode 300. Therefore, the first electrode 300 may be directly connected to the drain electrode 235 exposed by the hole. The first conductive layer may be formed on the insulation layer 250 by a sputtering process, a printing process, a spray process, a chemical vapor deposition process, an atomic layer deposition process, a vacuum evaporation process, a pulsed laser deposition process, etc. Further, the first electrode 300 may be formed using a metal, an alloy, a transparent conductive material, etc. In example embodiments, the first electrode 300 may serve as a reflective electrode, a transparent electrode, a transflective electrode depending on the materials. In some example embodiments, after a contact (not illustrated), a pad (not illustrated), or a plug (not illustrated) is formed on the drain electrode 235 to fill the hole in the insulation layer 250, the first electrode 300 may be formed on the insulation layer 250 and on the contact, the pad, or the plug. In this case, the first electrode 300 may be electrically connected to the drain electrode 235 through the contact, the pad, or the plug.

In example embodiments, an optical distance controlling insulation layer 350 may be formed on the first electrode 300 by a laser induced thermal imaging process. In this case, the optical distance controlling insulation layer 350 (see FIG. 13) may be formed in the second sub-pixel region (II).

Figure 9:
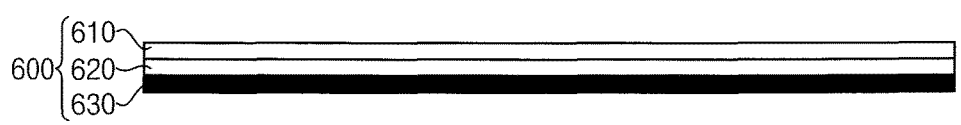
Figure 9:
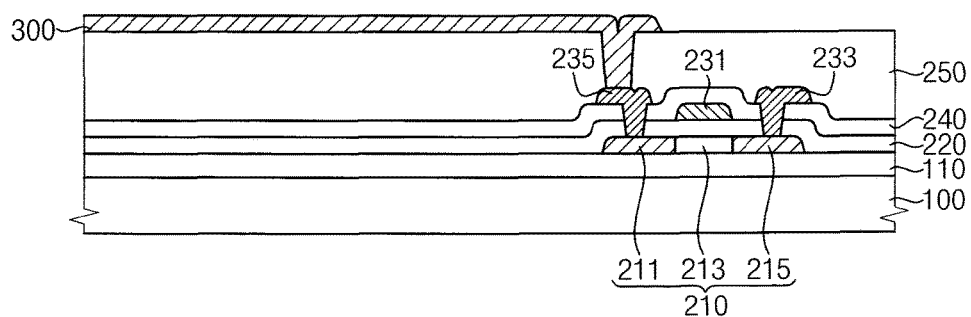

As illustrated in FIG. 9, a donor substrate 600 may be disposed above the substrate 100 having the first electrode 300. In this case, after the substrate 100 having the first electrode 300 is fixed using a supporting member (not illustrated), the donor substrate 600 may be aligned with respect to the substrate 100. The donor substrate 600 may include a plurality of layers disposed on a base substrate 610. In example embodiments, the donor substrate 600 may include a light-to-heat conversion (LTHC) layer 620 disposed on the base substrate 610 and a transfer layer 630 located on the light-to-heat conversion layer 620. Here, the transfer layer 630 of the donor substrate 600 may be used to form the optical distance controlling insulation layer 350. For example, the transfer layer 630 may be formed using a benzocyclobutene-based resin, an olefin-based resin, a polyimide-based resin, an acryl-based resin, a polyvinyl-based resin, a siloxane-based resin, etc. These may be used alone or in a combination thereof.

Figure 10:
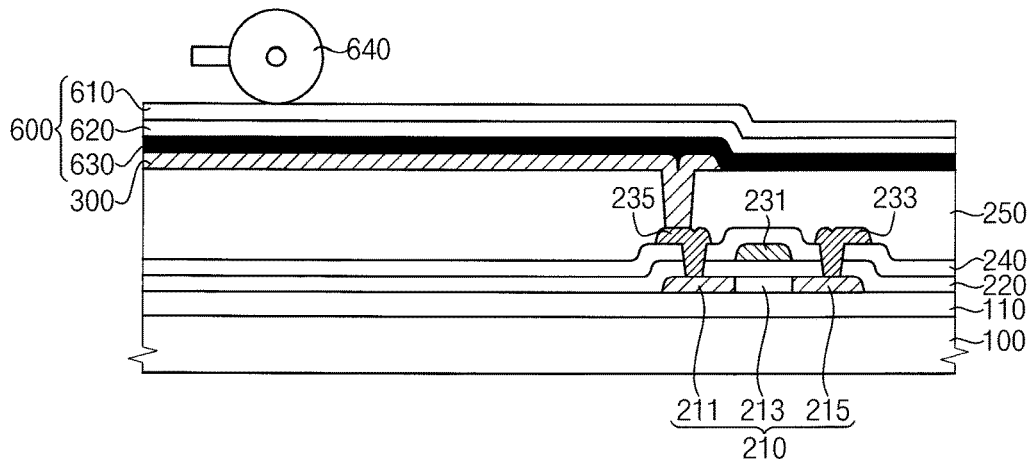

Referring to FIG. 10, the transfer layer 630 may be laminated on the first electrode 300 and the insulation layer 250 by contacting the donor substrate 600 with the substrate 100 and pressurizing the donor substrate 600 using a pressurizing member 640. For example, the pressurizing member 640 may include a roller, a crown press, etc. In some example embodiments, the donor substrate 600 may be pressurized using gases without an additional pressurizing member, so that the transfer layer 630 may be laminated on the first electrode 300 and the insulation layer 250.

Figure 11:
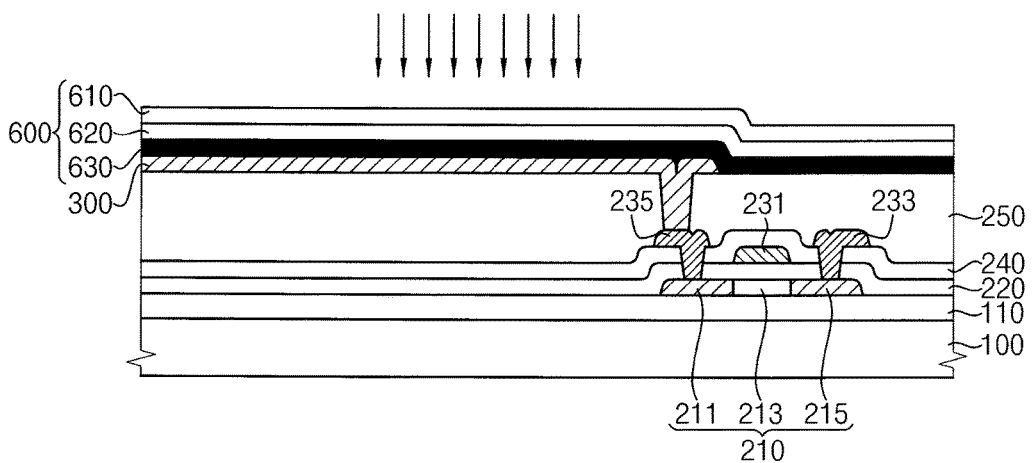

Referring to FIG. 11, a laser irradiation apparatus irradiates a laser beam (indicated using arrows) to the donor substrate 600 in the second sub-pixel region (II). In this case, the light-to-heat conversion layer 620 converts energy of the laser beam to thermal energy. Therefore, in the second sub-pixel region (II), adhesive strength between the transfer layer 630 and the first electrode 300 may be substantially larger than that between the transfer layer 630 and the light-to-heat conversion layer 620 because of the thermal energy. In the laser induced thermal imaging process according to example embodiments, a high resolution pattern may be obtained with a relatively low cost compared to a conventional thin film formation process using a mask.

Figure 12:
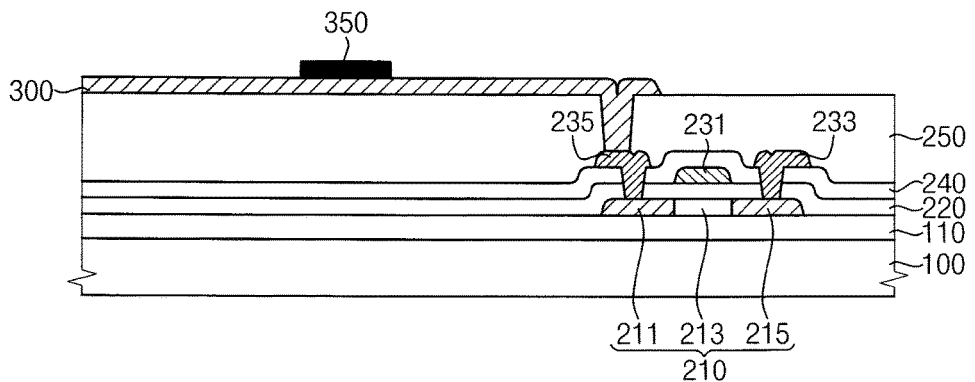

Referring to FIG. 12, the donor substrate 600 is removed from the substrate 100 to form the optical distance controlling insulation layer 350 in the second sub-pixel region (II). In example embodiments, the donor substrate 600 may be removed by arranging an air blowing apparatus (not illustrated) adjacent to the donor substrate 600, and blowing gases to an edge portion of the donor substrate 600.

In example embodiments, the optical distance controlling insulation layer 350 may be formed on the first electrode 300 in the first sub-pixel region (I) (see FIG. 13) by a laser induced thermal imaging process that is substantially the same as or substantially similar to the laser induced thermal imaging process described with reference to FIGS. 10 to 12. In this case, a thickness of the optical distance controlling insulation layer 350 may vary depending on a thickness of the transfer layer 630 of the donor substrate 600. Therefore, the optical distance controlling insulation layer 350 may have substantially different thicknesses in the first sub-pixel region (I) and the second sub-pixel region (II). In some example embodiments, the optical distance controlling insulation layer 350 may be formed on the first electrode in the third sub-pixel region (III) (see FIG. 13) by a laser induced thermal imaging process that is substantially the same as or substantially similar to the laser induced thermal imaging process described with reference to FIGS. 10 to 12.

Figure 13:
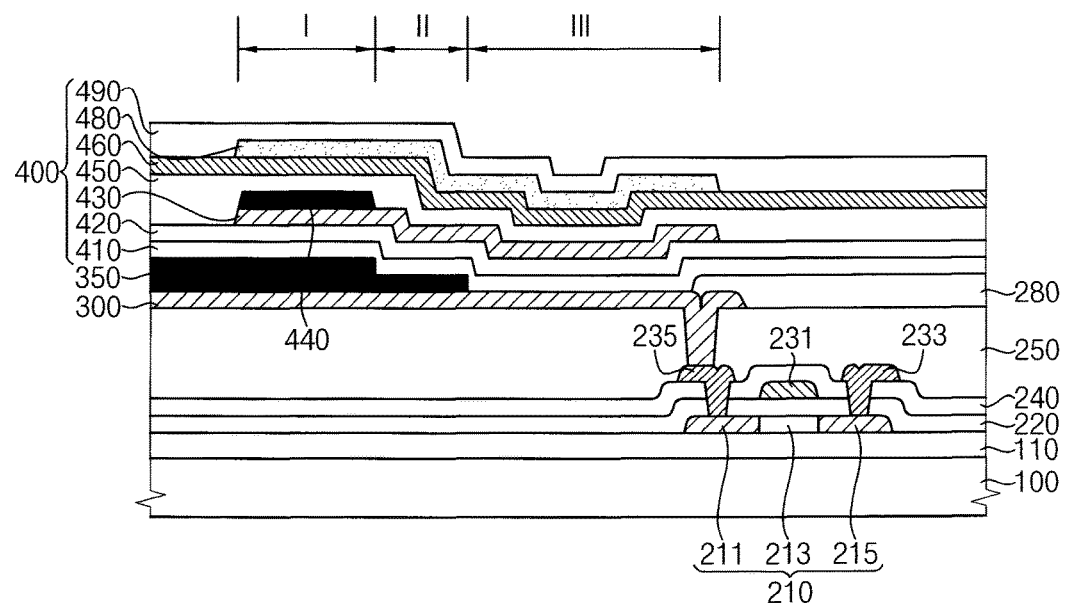

Referring to FIG. 13, a protection layer 280 may be formed on the insulation layer 250 in the non-display region of the display device. Here, the protection layer 280 may extend on a portion of the first electrode 300 in the display region of the display device. The protection layer 280 may be formed using an oxide, a nitride, an oxynitride, an organic insulation material, etc. Further, the protection layer 280 may be formed by a chemical vapor deposition process, a spin coating process, a plasma enhanced chemical vapor deposition process, a vacuum evaporation process, a printing process, etc.

A light emitting structure 400 may be formed on the substrate 100 having the optical distance controlling insulation layer 350 and the protection layer 280. In example embodiments, the light emitting structure 400 may be formed by sequentially forming a first hole injection layer 410, a hole transfer layer 420, a first organic light emitting layer 430, a blocking member 440, a charge generation layer 450, a second hole injection layer 460, a second organic light emitting layer 480, and an electron transfer layer 490 on the optical distance controlling insulation layer 350, the first electrode 300, and the protection layer 280. In example embodiments, the first organic light emitting layer 430 and the second organic light emitting layer 480 may be formed only in the display region, and the blocking member 440 may be formed on the first organic light emitting layer 430 in the first sub-pixel region (I). The first hole injection layer 410, the hole transfer layer 420, the first organic light emitting layer 430, the second hole injection layer 460, the second organic light emitting layer 480, and the electron transfer layer 490 including an organic material may be formed by a vacuum evaporation process, a printing process, a spin coating process, a laser induced thermal imaging process, etc. The charge generation layer 450 including a metal and/or a metal oxide may be formed by a sputtering process, a printing process, a spray process, a chemical vapor deposition process, etc. The blocking member 440 including an electron blocking layer or an exciton quenching layer may be formed on the first organic light emitting layer 430 by a laser induced thermal imaging process that is substantially the same as or substantially similar to the laser induced thermal imaging process described with reference to FIGS. 10 to 12.

Figure 14:
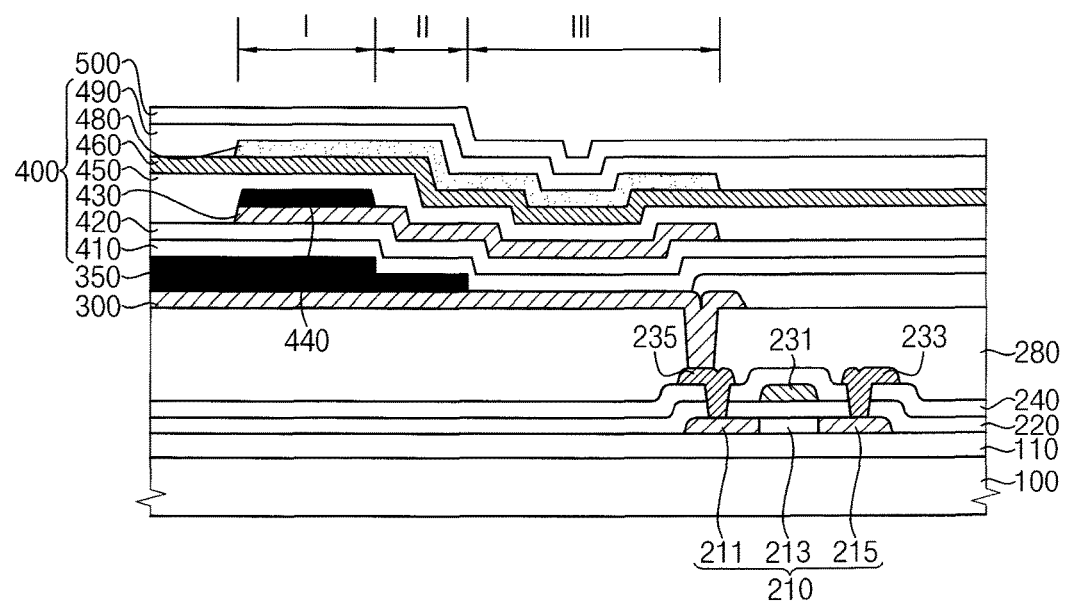

Referring to FIG. 14, a second electrode 500 may be formed on the electron transfer layer 490. The second electrode 500 may be formed using a metal, an alloy, and/or a transparent conductive material by a sputtering process, a printing process, a spray process, a chemical vapor deposition process, a vacuum evaporation process, an atomic layer deposition process, etc.

According to example embodiments, a display device having a light emitting structure may ensure an improved purity of colors of light without a color filter, a manufacturing cost of the display device may be reduced, and manufacturing processes of the display device may be simplified. The display device having various emission types such as a bottom emission type, a top emission type, or a dual emission type may be employed in various electronic and electric apparatuses such as televisions, mobile communication apparatuses, monitors, MP3 players, portable display apparatuses, etc.

The foregoing is illustrative of example embodiments of the present invention, and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of example embodiments as defined in the claims and their equivalents. In the claims, means-plus-function clauses are intended to cover the structures described herein as performing the recited function, and not only structural equivalents, but also equivalent structures.

What is claimed is:

1. A light emitting structure having a first sub-pixel region, a second sub-pixel region, and a third sub-pixel region, comprising:
    an optical distance controlling layer at only the first sub-pixel region and the second sub-pixel region;
    a first organic light emitting layer on the optical distance controlling layer; and
    a second organic light emitting layer on the first organic light emitting layer,
    wherein the optical distance controlling layer is completely offset from the third sub-pixel region in a stacking direction of the first organic light emitting layer and the optical distance controlling layer.

2. The light emitting structure of claim 1, wherein the optical distance controlling layer has different thicknesses in adjacent ones of the sub-pixel regions.

3. The light emitting structure of claim 1, further comprising:
    a hole injection layer between the optical distance controlling layer and the first organic light emitting layer.

4. The light emitting structure of claim 3, wherein the optical distance controlling layer comprises a material that is the same as that of the hole injection layer.

5. A light emitting structure having a first sub-pixel region, a second sub-pixel region, and a third sub-pixel region, comprising:
    an optical distance controlling layer at at least one of the first sub-pixel region, the second sub-pixel region, and the third sub-pixel region;
    a first organic light emitting layer on the optical distance controlling layer;
    a second organic light emitting layer on the first organic light emitting layer; and
    a blocking member at only the first sub-pixel region,
    wherein the blocking member is completely offset from the second sub-pixel region and the third sub-pixel region in a stacking direction of the first organic light emitting layer and the optical distance controlling layer.

6. The light emitting structure of claim 5,
    wherein the blocking member is between the first organic light emitting layer and the second organic light emitting layer.

7. The light emitting structure of claim 5, wherein the blocking member is on the second organic light emitting layer.

8. The light emitting structure of claim 5, wherein the blocking member is between the optical distance controlling layer and the first organic light emitting layer.

9. The light emitting structure of claim 1, wherein one of the first organic light emitting layer and the second organic light emitting layer is configured to emit a blue light.

10. A display device comprising:
- a substrate having a first sub-pixel region, a second sub-pixel region, and a third sub-pixel region;
- a first electrode on the substrate;
- an optical distance controlling layer on the first electrode at only the first sub-pixel region and the second sub-pixel region;
- a light emitting structure on the optical distance controlling layer, the light emitting structure comprising a first organic light emitting layer and a second organic light emitting layer on the first organic light emitting layer; and
- a second electrode on the light emitting structure,
- wherein the optical distance controlling layer is completely offset from the third sub-pixel region in a stacking direction of the first organic light emitting layer and the optical distance controlling layer.

11. The display device of claim 10, wherein the optical distance controlling layer has different thicknesses in adjacent ones of the sub-pixel regions.

12. The display device of claim 10, wherein the light emitting structure further comprises a hole injection layer between the optical distance controlling layer and the first organic light emitting layer.

13. The display device of claim 10, further comprising:
- a blocking member between the optical distance controlling layer and the second electrode.

14. The display device of claim 13, wherein a blocking member is at only the first sub-pixel region.

* * * * *